United States Patent
Tanioka et al.

(10) Patent No.: US 12,476,169 B2
(45) Date of Patent: Nov. 18, 2025

(54) SEMICONDUCTOR DEVICE

(71) Applicant: ROHM CO., LTD., Kyoto (JP)

(72) Inventors: Tomonori Tanioka, Kyoto (JP); Kazuo Egami, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 563 days.

(21) Appl. No.: 17/802,675

(22) PCT Filed: Feb. 17, 2021

(86) PCT No.: PCT/JP2021/005929
§ 371 (c)(1),
(2) Date: Aug. 26, 2022

(87) PCT Pub. No.: WO2021/182047
PCT Pub. Date: Sep. 16, 2021

(65) Prior Publication Data
US 2023/0101079 A1    Mar. 30, 2023

(30) Foreign Application Priority Data

Mar. 11, 2020   (JP) ................................ 2020-041841

(51) Int. Cl.
  *H01L 23/495* (2006.01)
  *H01L 23/00* (2006.01)
  *H01L 23/31* (2006.01)
(52) U.S. Cl.
  CPC .... *H01L 23/49541* (2013.01); *H01L 23/3107* (2013.01); *H01L 24/48* (2013.01); *H01L 2224/48151* (2013.01)
(58) Field of Classification Search
  None
  See application file for complete search history.

(56) References Cited

U.S. PATENT DOCUMENTS

| | | | |
|---|---|---|---|
| 10,211,131 B1* | 2/2019 | Kitnarong | H01L 23/3142 |
| 2018/0151479 A1* | 5/2018 | Nishikizawa | H01L 24/32 |

(Continued)

FOREIGN PATENT DOCUMENTS

| | | |
|---|---|---|
| JP | 2006-303215 A | 11/2006 |
| JP | 2013-153032 A | 8/2013 |

(Continued)

OTHER PUBLICATIONS

Office Action received in the corresponding Japanese Patent application, Jul. 23, 2024, and machine translation (11 pages).

(Continued)

*Primary Examiner* — Sue A Purvis
*Assistant Examiner* — Jordan M Klein
(74) *Attorney, Agent, or Firm* — HSML P.C.

(57) ABSTRACT

A semiconductor device is provided, which is configured to improve the adhesion between the resin part and the leads without interfering with proper operation of the semiconductor device. The semiconductor device includes a semiconductor element 1, a first lead 2 including a first pad portion 21, a second lead 3 including a second pad portion 31, a conductor member 61, and a resin part 8. The first pad portion 21 has a first-pad obverse surface 21a including a first smooth region 211 to which an element reverse surface 1b is bonded, and a first rough region 212 spaced apart from the semiconductor element 1 as viewed in z direction and has a higher roughness than the first smooth region 211. The second pad portion 31 has a second-pad obverse surface 31a including a second smooth region 311 to which a second bonding portion 612 is bonded, and a second rough region 312 spaced apart from the second bonding portion 612 as viewed in z direction and has a higher roughness than the second smooth region 311.

13 Claims, 15 Drawing Sheets

(56) References Cited

U.S. PATENT DOCUMENTS

2018/0277468 A1* 9/2018 Kondo .............. H01L 23/49548
2020/0043835 A1* 2/2020 Nomura .................. H01L 24/48

FOREIGN PATENT DOCUMENTS

| JP | 2017-168871 A | 9/2017 |
| JP | 2017-208385 A | 11/2017 |
| JP | 2018-85480 A | 5/2018 |
| JP | 2018-157023 A | 10/2018 |
| JP | 2018-182101 A | 11/2018 |

OTHER PUBLICATIONS

International Search Report issued in machine translation, Apr. 20, 2021 (4 pages).
Office Action issued in corresponding Chinese Patent application No. 202180019789.3, Jun. 24, 2025, and machine translation (14 pages).

* cited by examiner

SEMICONDUCTOR DEVICE

TECHNICAL FIELD

The present disclosure relates to semiconductor devices.

BACKGROUND ART

Patent document 1 discloses one conventional semiconductor device. The semiconductor device includes a semiconductor element, a plurality of leads, a plurality of wires, and a resin part. The semiconductor element is mounted on one lead. The wires connect the semiconductor element to the other leads. The resin part covers the semiconductor element, the wires and the leads. The leads have plating films coating their surfaces. The plating films are provided to increase the surface area of the leads, thereby improving the adhesion of the leads to the resin part.

PRIOR ART DOCUMENTS

Patent Documents

Patent document 1: JP-A-2006-303215

SUMMARY OF THE INVENTION

Problem to be Solved by the Invention

Such plating films as means for improving the adhesion, however, may have undesirable effects on the semiconductor device.

The present disclosure has been conceived in view of the circumstances described above and aims to provide a semiconductor device configured to improve the adhesion between a resin part and a lead without affecting proper operation of the semiconductor device.

Means to Solve the Problem

The present disclosure provides a semiconductor device that includes: a semiconductor element including an element obverse surface and an element reverse surface facing away from each other in a first direction; a first lead including a first pad portion on which the semiconductor element is mounted; a second lead including a second pad portion disposed side by side with the first pad portion in a second direction perpendicular to the first direction; a conductor member including a first bonding portion bonded to the semiconductor element and a second bonding portion bonded to the second pad portion; and a resin part covering the semiconductor element, the conductor member, the first pad portion and the second pad portion. The first pad portion comprises a first-pad obverse surface including a first smooth region to which the element reverse surface is bonded and a first rough region spaced apart from the semiconductor element as viewed in the first direction, where the first rough region has a higher surface roughness than the first smooth region. The second pad portion comprises a second-pad obverse surface including a second smooth region to which the second bonding portion is bonded and a second rough region spaced apart from the second bonding portion as viewed in the first direction, where the second rough region has a higher surface roughness than the second smooth region.

Advantages of Invention

An embodiment of the present disclosure provides a semiconductor device configured to improve the adhesion between the resin part and the leads without interfering with the proper operation of the semiconductor device.

Other features and advantages of the present disclosure will be more apparent through the detailed description given below with reference to the accompanying drawings.

MODE FOR CARRYING OUT THE INVENTION

Figure 1:
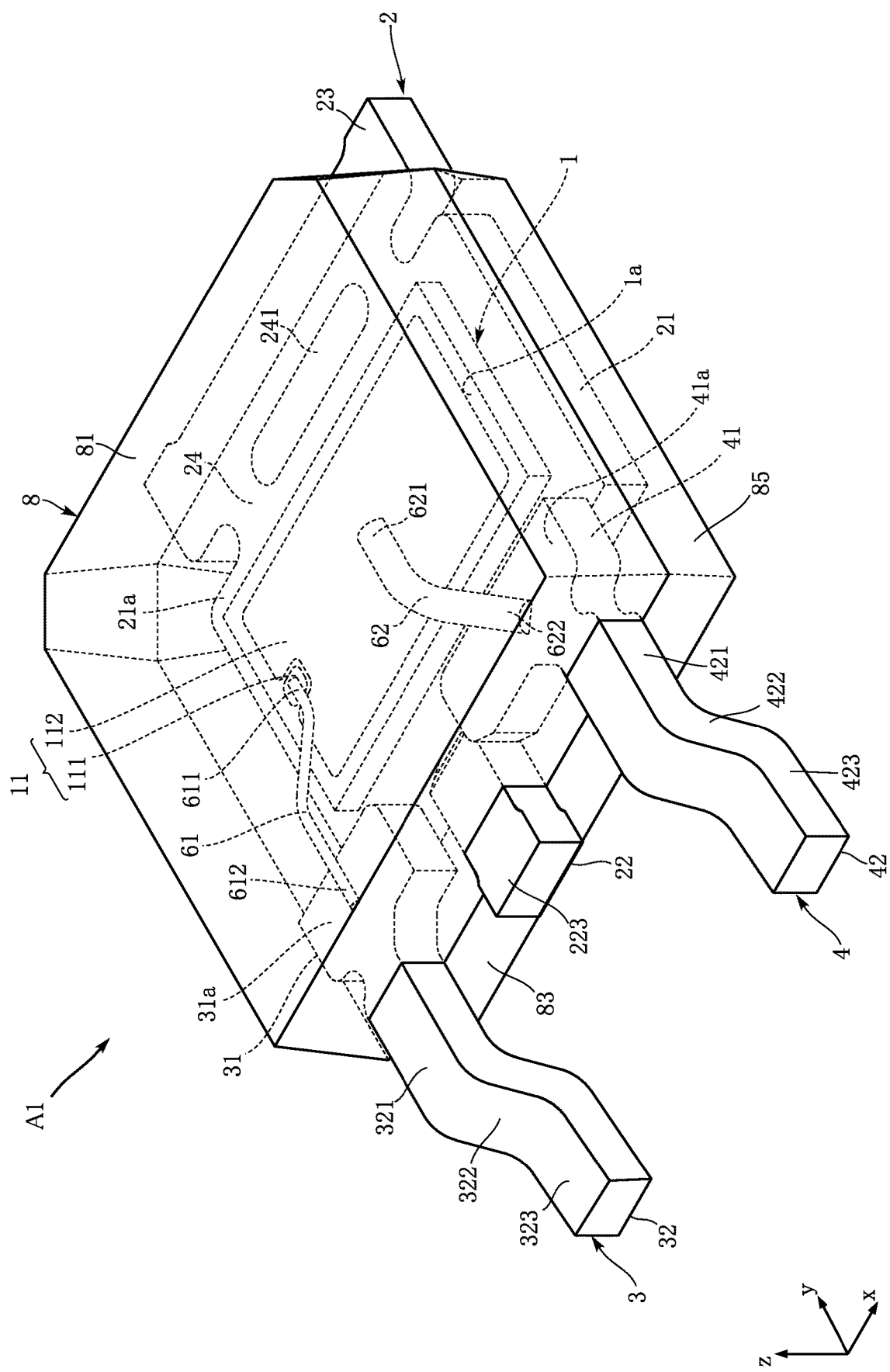
FIG. 1 is a perspective view of a semiconductor device according to a first embodiment of the present disclosure.

Preferred embodiments of the present disclosure will be described below with reference to the drawings.

In the present disclosure, the ordinal terms, such as "first", "second" and "third" modifying elements are used simply as labels and do not impose any limitations as to the order of the elements.

First Embodiment

FIGS. 1 to 12 show a semiconductor device according to a first embodiment of the present disclosure. The semiconductor device A1 of this embodiment includes a semiconductor element 1, a first lead 2, a second lead 3, a second lead 4, a conductor member 61, a conductor member 62 and a resin part 8.

Figure 2:
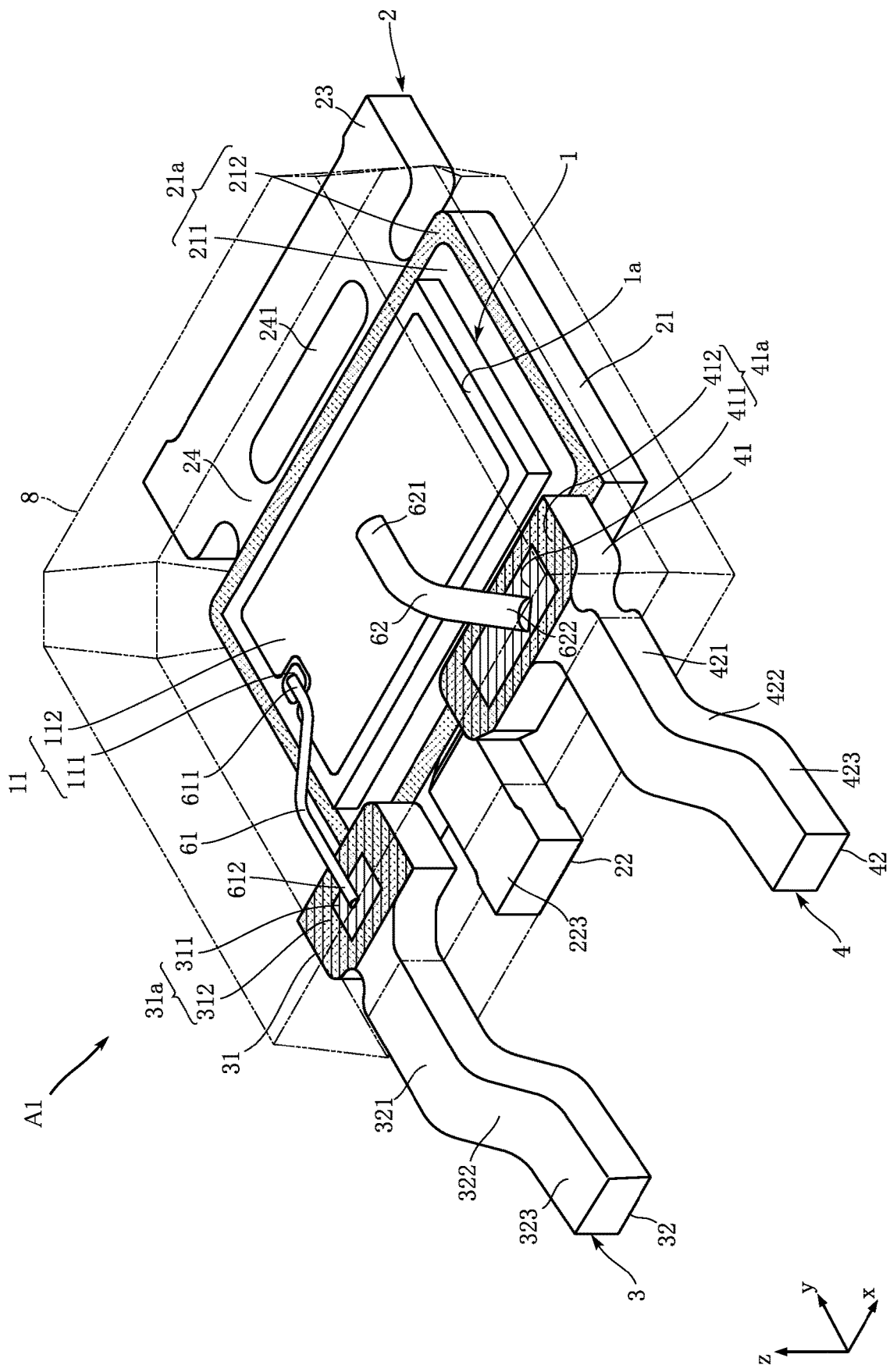
FIG. 2 is a perspective view of the semiconductor device according to the first embodiment of the present disclosure.
Figure 3:
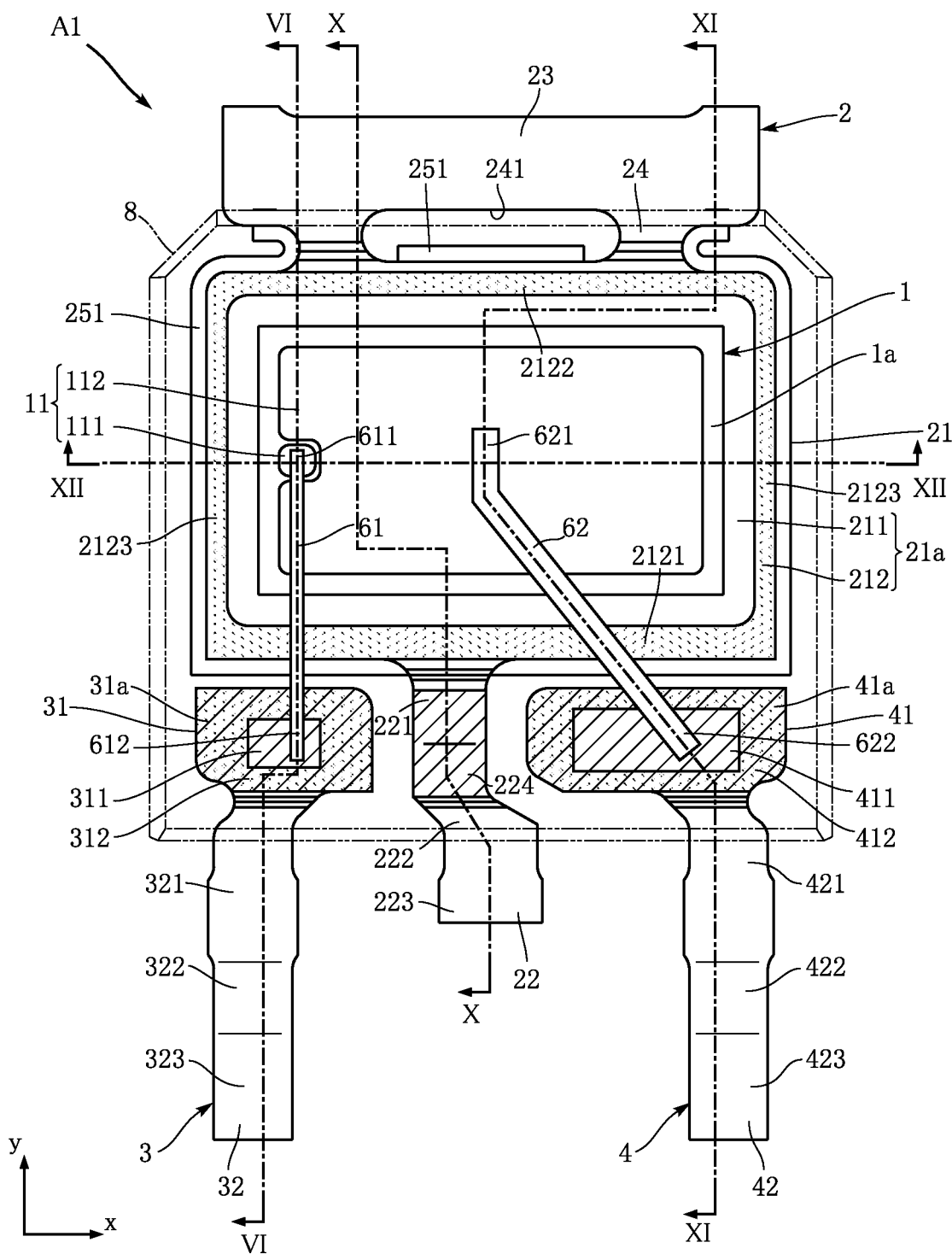
FIG. 3 is a plan view of the semiconductor device according to the first embodiment of the present disclosure.
Figure 4:
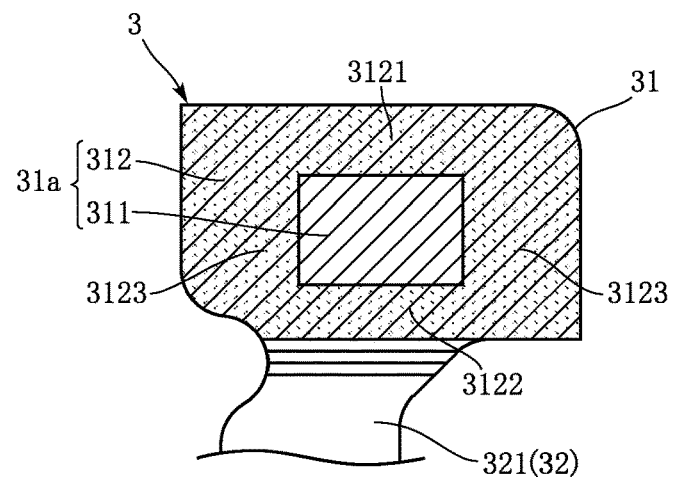
FIG. 4 is a plan view of a second pad portion of the semiconductor device according to the first embodiment of the present disclosure.
Figure 4:
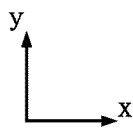
Figure 5:
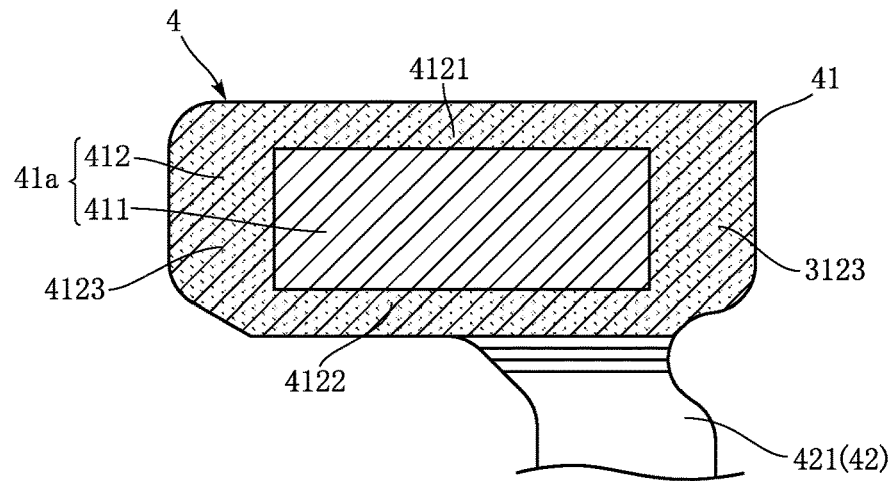
FIG. 5 is a plan view of a second pad portion of the semiconductor device according to the first embodiment of the present disclosure.
Figure 5:
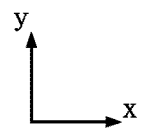
Figure 6:
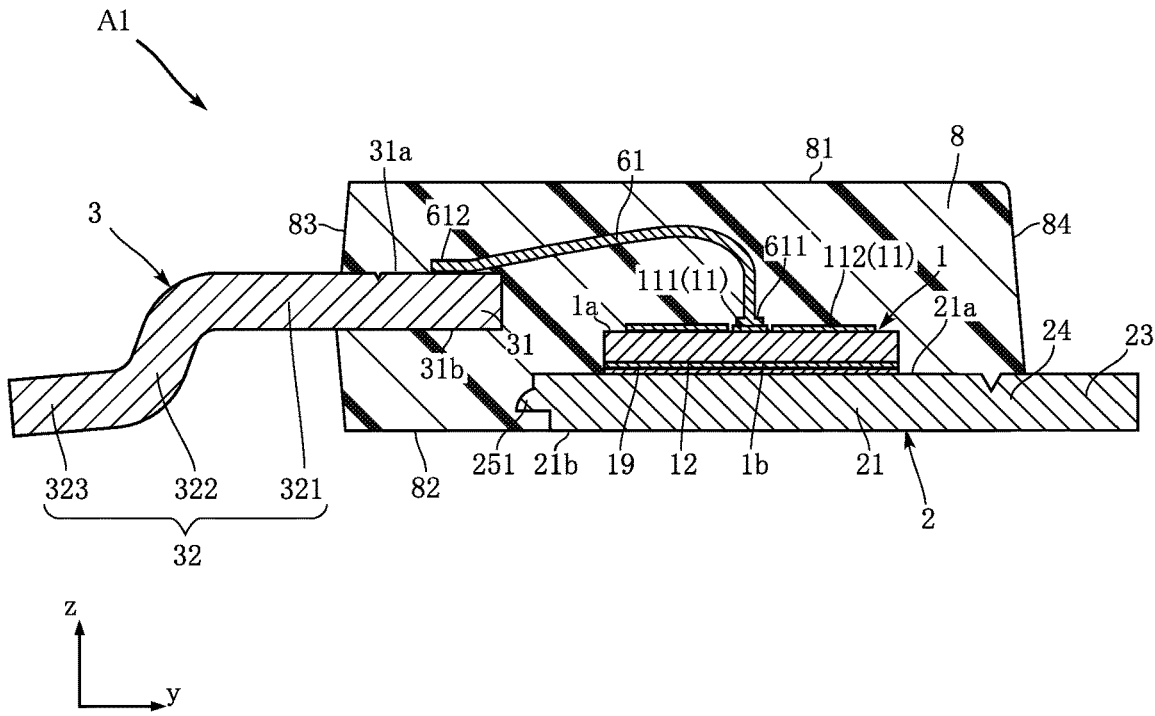
FIG. 6 is a sectional view taken along line VI-VI of FIG. 3.
Figure 7:
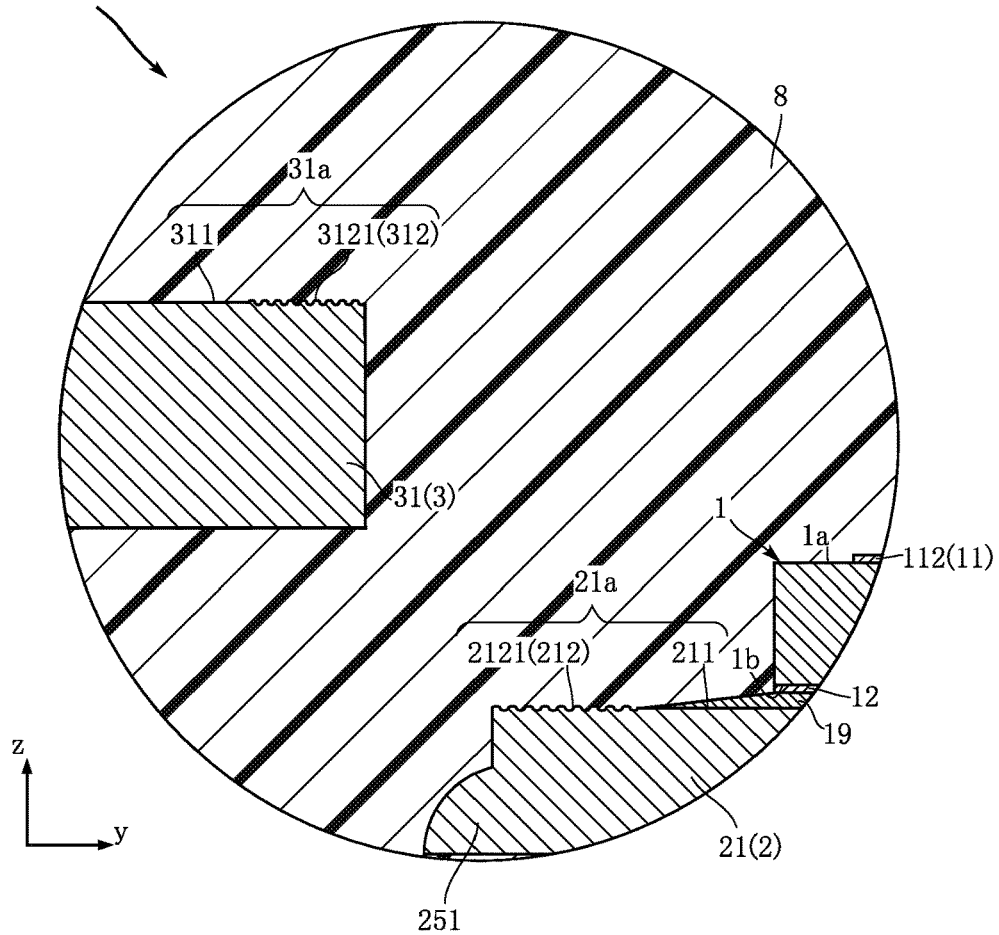
FIG. 7 is an enlarged fragmentary sectional view of the semiconductor device according to the first embodiment of the present disclosure.
Figure 8:
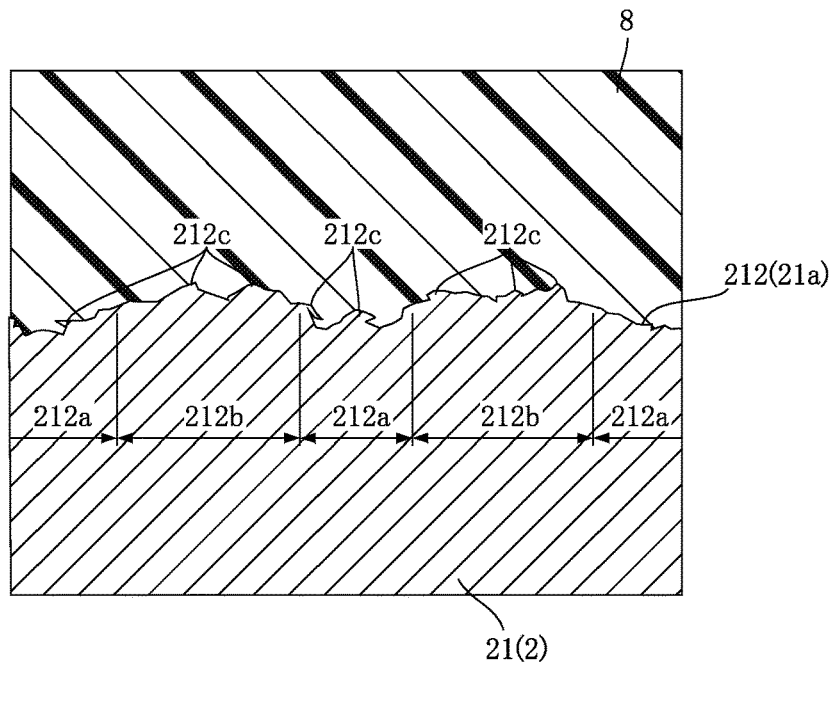
FIG. 8 is an enlarged fragmentary sectional view of a first rough region of the semiconductor device according to the first embodiment of the present disclosure.
Figure 9:
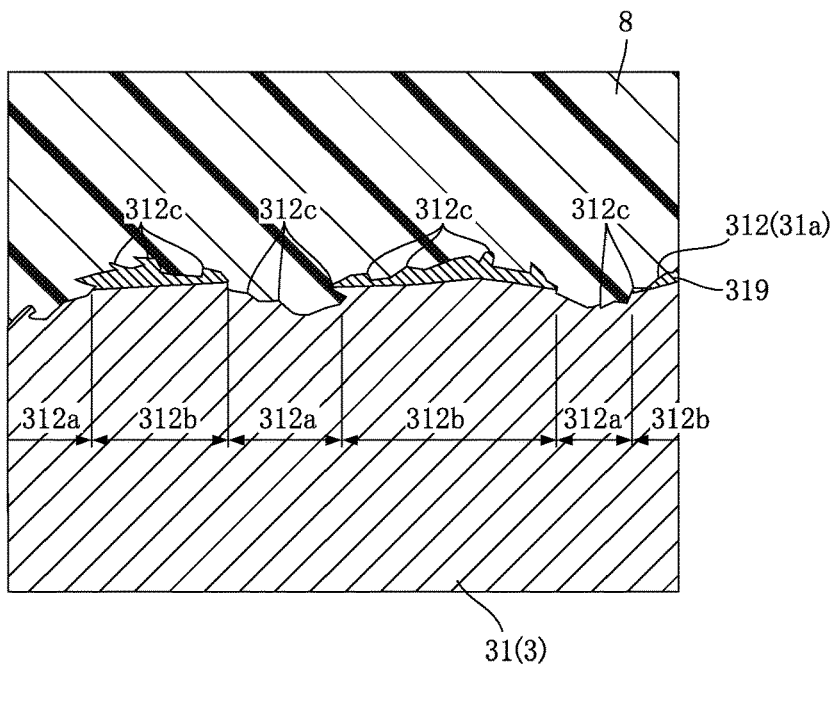
FIG. 9 is an enlarged fragmentary sectional view of a second rough region of the semiconductor device according to the first embodiment of the present disclosure.
Figure 10:
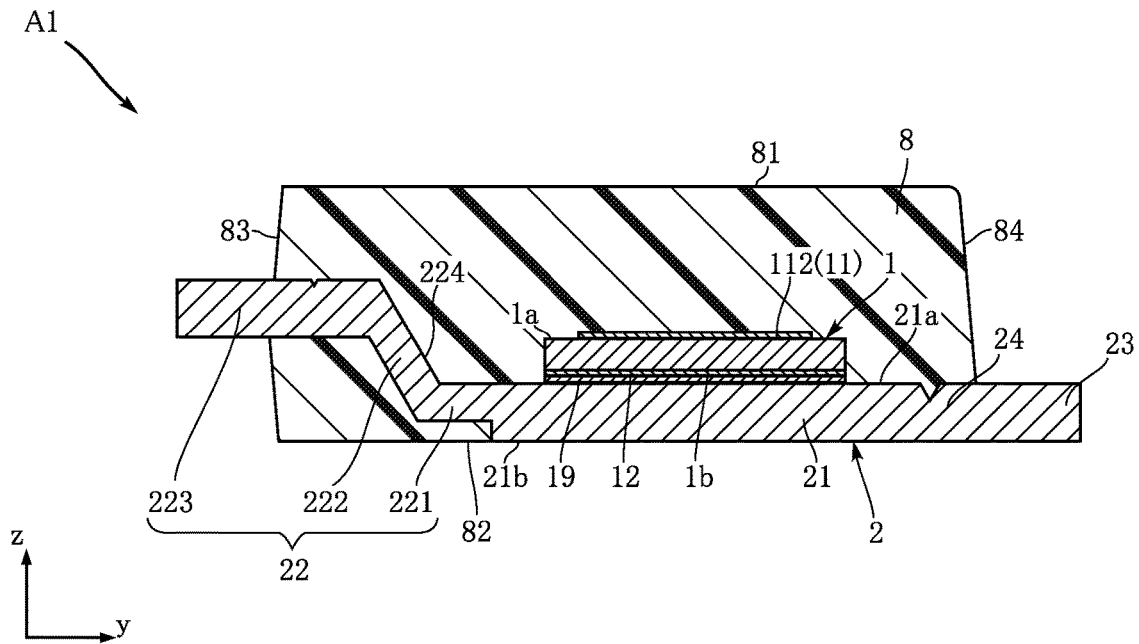
FIG. 10 is a sectional view taken along line X-X of FIG. 3.
Figure 11:
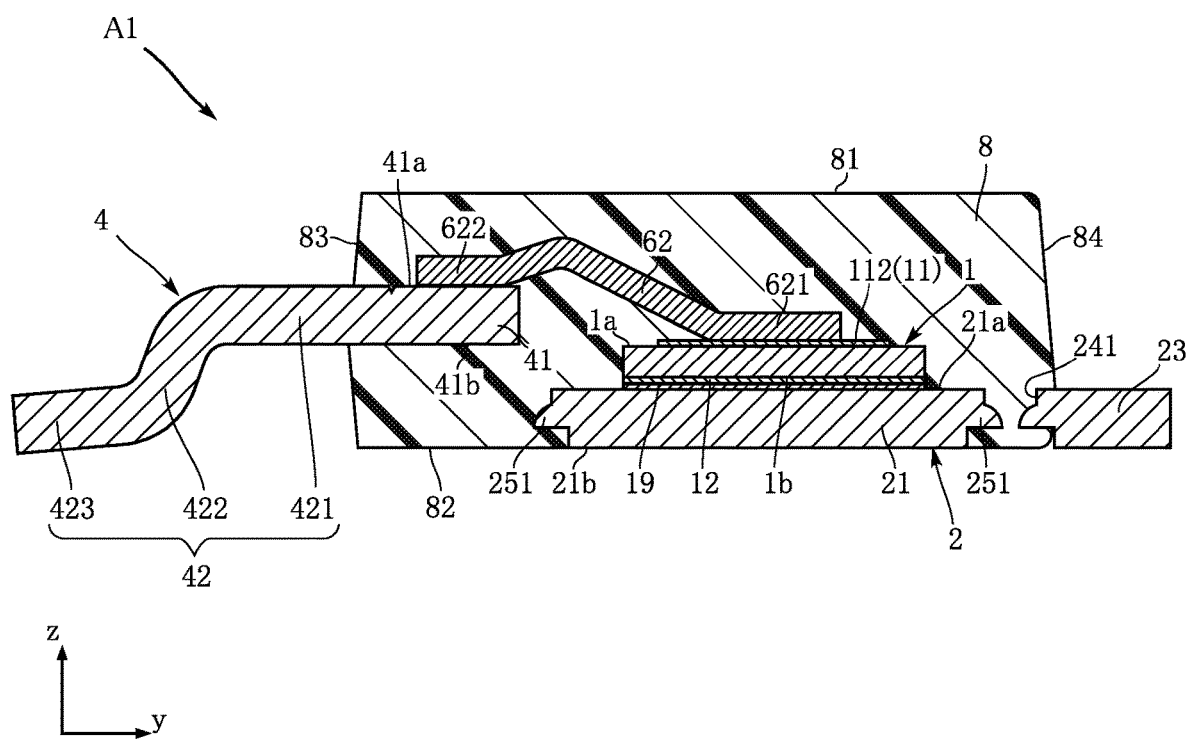
FIG. 11 is a sectional view taken along line XI-XI of FIG. 3.
Figure 12:
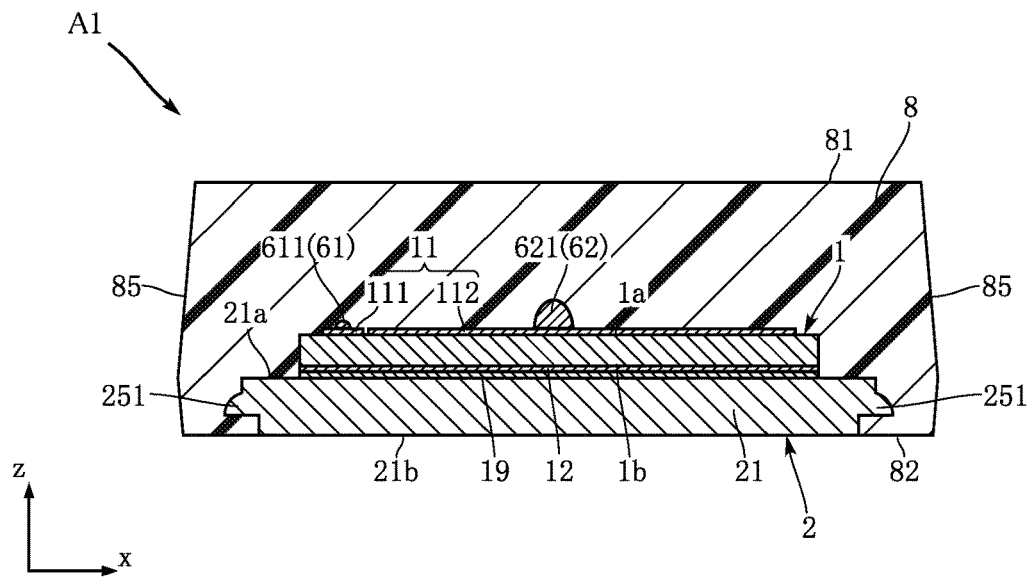
FIG. 12 is a sectional view taken along line XII-XII of FIG. 3.

FIG. 1 is a perspective view of the semiconductor device A1. FIG. 2 is a perspective view of the semiconductor device A1. FIG. 3 is a plan view of the semiconductor device A1. FIG. 4 is a plan view of a second pad portion of the semiconductor device A1. FIG. 5 is a plan view of a second pad portion of the semiconductor device A1. FIG. 6 is a sectional view taken along line VI-VI of FIG. 3. FIG. 7 is an enlarged fragmentary sectional view of the semiconductor device A1. FIG. 8 is an enlarged sectional view of a first rough region of the semiconductor device A1. FIG. 9 is an enlarged sectional view of a second rough region of the semiconductor device A1. FIG. 10 is a sectional view taken along line X-X of FIG. 3. FIG. 11 is a sectional view taken along line XI-XI of FIG. 3. FIG. 12 is a sectional view taken along line XII-XII of FIG. 3. The z, y and x directions shown in these figures correspond to the first, second and third directions of the present disclosure, respectively.

[Semiconductor Element 1]

The semiconductor element 1 is an electric component that is a functional core of the semiconductor device A1. The semiconductor element 1 is made of a semiconductor material, examples of which include, but not limited to, silicone (Si), silicon carbide (SiC) and gallium arsenide (GaAs). The semiconductor element 1 may be a power semiconductor chip, such as a metal oxide semiconductor field effect transistor (MOSFET). The semiconductor element 1 in this embodiment is a MOSFET. In a different embodiment, however, the semiconductor element 1 may be a different type of transistor, such as an insulated gate bipolar transistor (IGBT), or a diode, such as a Schottky barrier diode or a fast recovery diode.

The semiconductor element 1 of this embodiment has an element obverse surface 1a, an element reverse surface 1b, a plurality of obverse surface electrodes 11 and a drain electrode 12. The element obverse surface 1a faces in a first sense of the z direction (upward in FIGS. 1, 2 and 6). The element reverse surface 1b opposite from the element obverse surface 1a faces in a second sense of the z direction (downward in FIGS. 1, 2 and 6).

As shown in FIGS. 1 to 3, the obverse surface electrodes 11 are disposed on the element obverse surface 1a. According to this embodiment, the obverse surface electrodes 11 include a gate electrode 111 and a source electrode 112. The gate electrode 111 is used to apply a gate voltage to the semiconductor device A1 that operates as a switching element. The source electrode 112 is used as an input/output terminal. In the illustrated example, the gate electrode 111 is smaller than the source electrode 112. The gate electrode 111 is offset on the element obverse surface 1a in a first sense of the x direction (to the left in FIG. 3). The drain electrode 12 is disposed on the element reverse surface 1b and used as another input/output terminal, along with the source electrode 112.

[First Lead 2]

The first lead 2 is a component on which the semiconductor element 1 is mouthed. The first lead 2 is made of a first metal, which is a conductive material. The first metal in this embodiment is Cu, and other examples of the first metal include nickel (Ni), alloys of Cu, alloys of Ni, and Alloy 42. The first lead 2 may be prepared from a thin rectangular plate of metal, such as Cu, by punching, cutting and bending the plate into a desired shape. As shown in FIGS. 1 to 3, 6, 10 and 11, the first lead 2 of this embodiment includes a first pad portion 21, an extended portion 22, a projected portion 23 and a connecting portion 24.

The first pad portion 21 has a first-pad obverse surface 21a and a first-pad reverse surface 21b. The first-pad obverse surface 21a faces in the first sense of the z direction, and the first-pad reverse surface 21b faces in the second sense of the z direction. The semiconductor element 1 is mounted on the first-pad obverse surface 21a. In the illustrated example, the first pad portion 21 is substantially rectangular as viewed in the z direction, although a different shape is also possible. According to this embodiment, the first-pad reverse surface 21b is exposed from the resin part 8 as shown in FIGS. 6 and 10 to 12.

The first-pad obverse surface 21a includes a first smooth region 211 and a first rough region 212. In FIGS. 2 to 5, the doted areas represent regions roughened by roughening means, and the diagonally shaded areas represent regions coated with plating. FIG. 7 is an enlarged fragmentary view of FIG. 6. The first-pad obverse surface 21a shown in the figures are not plated or coated, so that the first metal, such as Cu, remains exposed. The first smooth region 211 is bonded to the element reverse surface 1b of the semiconductor element 1. In this embodiment, the drain electrode 12 disposed on the element reverse surface 1b is electrically bonded to the first smooth region 211 by the conductive bonding material 19. In the illustrated example, the conductive bonding material 19 is spread substantially across the first smooth region 211. However, where and how much of the first smooth region 211 should be covered by the conductive bonding material 19 is not limited. As viewed in the z direction, the first smooth region 211 completely surrounds the semiconductor element 1 and extends outward from the semiconductor element 1 in all directions. The first smooth region 211 is not limited to a specific shape, and is substantially rectangular in the illustrated example.

The first rough region 212 is spaced apart from the semiconductor element 1 as viewed in the z direction. The first rough region 212 is rougher than the first smooth region 211. The means for increasing the roughness of the first rough region 212 relative to the first smooth region 211 is not specifically limited. For example, the first smooth region 211 may be a surface of a common metal plate as a lead frame, and the first rough region 212 may be a surface intentionally roughened by laser. The laser used for roughening is not limited to a specific type, and suitable examples include, but not limited to, UV lasers, IR lasers, and green lasers. In the illustrated example, the first rough region 212 extends to the edges of the first-pad obverse surface 21a.

The first rough region 212 is not limited to a specific shape or size. As shown in FIG. 3, the first rough region 212 of this embodiment includes a first segment 2121, a second segment 2122 and a pair of third segments 2123. The first segment 2121 is adjacent to the first smooth region 211 in a first sense of the y direction (on the side on the second pad portions 31 and 41 are located, as will be described later). The second segment 2122 is adjacent to the first smooth region 211 on the side opposite from the first segment 2121 (and also from the second pad portions 31 and 41, as will be described later). The pair of third segments 2123 are adjacent to the first smooth region 211 on the opposite sides in the x direction. In the illustrated example, the first segment 2121, the second segment 2122 and the third segment 2123 of the first rough region 212 define a rectangular frame surrounding the first smooth region 211 as viewed in the z direction.

The first rough region 212 may be dimensioned as follows. For example, the first segment 2121 has a y-direction dimension smaller than the y-direction dimension of the first smooth region 211 that is measured between the first segment 2121 and the semiconductor element 1. The second segment 2122 has a y-direction dimension smaller than the y-direction dimension of the first smooth region 211 that is measured between the second segment 2122 and the semiconductor element 1. Each third segment 2123 has an x-direction dimension smaller than the x-direction dimension of the first smooth region 211 that is measured between the third segment 2123 and the semiconductor element 1.

FIG. 8 is a further enlarged sectional view of a portion of the first rough region 212. This figure shows an example of the first rough region 212 roughened by using a green laser, for example. The first rough region 212 includes a plurality of recessed portions 212a and raised portions 212b. The recessed portions 212a and the raised portions 212b are alternately located. The first rough region 212 of such a profile can be obtained by repeatedly scanning a green laser in a predetermine direction to form a plurality of grooves on the first-pad obverse surface 21a. Alternatively, circular recesses or other shaped recesses may be formed to provide the first rough region 212 having a plurality of recessed portions 212a and raised portions 212b.

The first rough region 212 of the illustrated example additionally includes a plurality of micro-protrusions 212c. The micro-protrusions 212c are significantly smaller than the recessed portions 212a and the raised portions 212b, and form on the surfaces of the recessed portions 212a and the raised portions 212b. The present inventors have found that the use of a green laser for roughening the first rough region 212 promotes the formation of a plurality of micro-protrusions 212c of complex geometries substantially throughout the first rough region 212.

The first pad portion 21 of this embodiment is formed with an anchoring feature 251 as shown in FIGS. 3, 11 and 12. The anchoring feature 251 is a portion protruding from the outer edges of the first pad portion 21 in the x direction or y direction. The anchoring feature 251 comes into fixing engagement with, for example, a portion of the resin part 8, thereby enabling the resin part 8 to retain the first pad portion 21.

As shown in FIGS. 1 to 3 and 10, the extended portion 22 extends from the first pad portion 21 in the first sense of the y direction (toward the side on which the second pad portions 31 and 41 are located). The extended portion 22 is not limited to a specific shape. In the illustrated example, the extended portion 22 includes a root 221, a bend 222 and an extreme end 223.

The root 221 extends from the first pad portion 21 in the first sense of the y direction and has a shape elongated in the y direction. The bend 222 is connected from the y-direction end of the root 221 and bent toward the first sense of the z direction (upward in FIG. 10) as viewed in the x direction. The extreme end 223 extends from the bend 222 in the first sense of the y direction. In the illustrated example, a portion of the extreme end 223 protrudes from the resin part 8.

As shown in FIGS. 1 to 3 and 10, the projected portion 23 is offset relative to the first pad portion 21 in a second sense of the y direction. The projected portion 23 is not limited to a specific shape. In the illustrated example, the projected portion 23 as viewed in the z direction is substantially rectangular and elongated in the x direction. Most of the projected portion 23 is exposed from the resin part 8.

The connecting portion 24 connects the first pad portion 21 and the projected portion 23. In the example shown in FIG. 3, the connecting portion 24 has a through hole 241. The through hole 241 penetrates the connecting portion 24 in the z direction.

According to this embodiment, the extended portion 22 has a plating layer 224. The plating layer 224 is a metal layer formed by plating the first metal of the first lead 2, such as Cu, with a second metal. Examples of the second metal used for forming the plating layer 224 include, but not limited to, Ni and Ag.

[Second Lead 3]

The second lead 3 is a component to which the conductor member 61 is bonded, as will be described later. The second lead 3 is made of the first metal, which is a conductive material. The first metal used in this embodiment is Cu, and other examples the first metal include nickel (Ni), alloys of Cu, alloys of Ni, and Alloy 42. The second lead 3 may be prepared from a thin rectangular plate of metal, such as Cu, by punching, cutting and bending the plate into a desired shape. As shown in FIGS. 1 to 4 and 6, the second lead 3 of this embodiment includes a second pad portion 31 and a terminal portion 32.

The second pad portion 31 has a second-pad obverse surface 31a and a second-pad reverse surface 31b. The second-pad obverse surface 31a faces in the first sense of the z direction, and the second-pad reverse surface 31b faces in the second sense of the z direction. The second-pad obverse surface 31a is bonded to the conductor member 61. In the illustrated example, the second pad portion 31 is substantially rectangular as viewed in the z direction, although a different shape is also possible. As shown in FIG. 6, the second-pad obverse surface 31a and the second-pad reverse surface 31b of this embodiment are covered by the resin part 8.

As shown in FIGS. 1 to 3 and 6, the second pad portion 31 as viewed in the z direction is located in the first sense of the y direction from the first pad portion 21 and in the first sense of the x direction from the extended portion 22. In the z direction, the second pad portion 31 is located in the first sense of the z direction (upward in FIG. 6) from the first pad portion 21 and the extended portion 22.

As shown in FIGS. 3 and 4, the second-pad obverse surface 31a includes a second smooth region 311 and a second rough region 312. FIG. 7 is an enlarged fragmentary view of FIG. 6. The second-pad obverse surface 31a of the illustrated example is plated with a layer made of a second metal. Examples of the second metal include, but not limited to, Ni and Ag. The second smooth region 311 is bonded to a later-described second bonding portion 612 of the conductor member 61. As viewed in the z direction, the second smooth region 311 completely surrounds the second bonding portion 612 and extends outward in all directions. The second smooth region 311 is not limited to a specific shape, and is substantially rectangular in the illustrated example. The second smooth region 311 of the illustrated example is plated. Preferably, the second smooth region 311 has an x-direction dimension that is at least double the x-direction dimension of the second bonding portion 612.

The second rough region 312 is spaced apart from the second bonding portion 612 as viewed in the z direction. The second rough region 312 is rougher than the second smooth region 311. The means for increasing the roughness of the second rough region 312 relative to the second smooth region 311 is not specifically limited. For example, the second smooth region 311 may be a surface of a common metal plate as a lead frame, and the second rough region 312 may be a surface roughened by laser. The laser used for roughening is not limited to a specific type, and suitable examples include, but not limited to, UV lasers, IR lasers, and green lasers. In the illustrated example, the second rough region 312 extends to the edges of the second-pad obverse surface 31a.

The second rough region 312 is not limited to a specific shape or size. As shown in FIG. 4, the second rough region 312 of this embodiment includes a first segment 3121, a second segment 3122 and a pair of third segments 3123. The first segment 3121 is adjacent to the second smooth region 311 in the second sense of the y direction (on the side on which the first pad portion 21 is located). The second segment 3122 is adjacent to the second smooth region 311 on the opposite side from the first segment 3121 (and also from the first pad portion 21). The pair of third segments 3123 are adjacent to the second smooth region 311 on the opposite sides in the x direction. In the illustrated example, the first segment 3121, the second segment 3122 and the third segment 3123 of the second rough region 312 define a rectangular frame surrounding the second smooth region 311 as viewed in the z direction.

FIG. 9 is a further enlarged sectional view of a portion of the second rough region 312. The figure shows an example of the second rough region 312 roughened by using a green laser, for example. The second rough region 312 includes a plurality of recessed portions 312a and raised portions 312b. The recessed portions 312a and the raised portions 312b are alternately located. The second rough region 312 of such a profile can be obtained by repeatedly scanning a green laser in a predetermine direction to form a plurality of grooves on the second-pad obverse surface 31a. Alternatively, circular recesses or other shaped recesses may be formed to provide the second rough region 312 having a plurality of recessed portions 312a and raised portions 312b.

In the illustrated example, the recessed portions 312a are regions where the first metal of Cu forming the second lead 3 is exposed. In contrast, the raised portions 312b are provided by fragments of a plated metal layer 319 made of the second metal, such as Ni. This second rough region 312 can be formed by plating the first metal with the metal layer 319, and then roughening the resulting surface using a roughening means, such as a green laser. In one example, the metal layer 319 has a thickness of 2 to 4 μm, and the depth of the roughness of the second rough region 312 (the distance from the bottom of a recessed portion 312a to the top of a raised portion 312b) is greater than the thickness of the metal layer 319. For example, the depth is from 5 to 8 μm.

The second rough region 312 of the illustrated example additionally includes a plurality of micro-protrusions 312c. The micro-protrusions 312c are significantly smaller than the recessed portions 312a and the raised portions 312b, and form on the surfaces of the recessed portions 312a and the raised portions 312b. The present inventors have found that the use of a green laser for roughening the second rough region 312 promotes the formation of a plurality of micro-protrusions 312c of complex geometries substantially throughout the second rough region 312.

As shown in FIGS. 1 to 3 and 6, the terminal portion 32 extends from the second pad portion 31 in the first sense of the y direction. The terminal portion 32 is used when the semiconductor device A1 is mounted on a circuit board, for example. The terminal portion 32 is not limited to a specific shape. In the illustrated example, the terminal portion 32 includes a root 321, a bend 322 and an extreme end 323.

The root 321 extends from the second pad portion 31 in the first sense of the y direction and has a shape elongated in the y direction. A portion of the root 321 is exposed from the resin part 8. The bend 322 is connected from the y-direction end of the root 321 and bent toward the second sense of the z direction (downward in FIG. 6) as viewed in the x direction. The extreme end 323 extends from the bend 322 in the first sense of the y direction.

[Second Lead 4]

The second lead 4 is a component to which the conductor member 62 is bonded, as will be described later. The second lead 4 is made of the first metal, which is a conductive material. The first metal used in this embodiment is Cu, and other examples of the first metal include nickel (Ni), alloys of Cu, alloys of Ni, and Alloy 42. The second lead 4 may be prepared from a thin rectangular plate of metal, such as Cu, by punching, cutting and bending the plate into a desired shape. As shown in FIGS. 1 to 3, 5 and 11, the second lead 4 of this embodiment includes a second pad portion 41 and a terminal portion 42.

The second pad portion 41 has a second-pad obverse surface 41a and a second-pad reverse surface 41b. The second-pad obverse surface 41a faces in the first sense of the z direction, and the second-pad reverse surface 41b faces in the second sense of the z direction. The second-pad obverse surface 41a is bonded to the conductor member 62. In the illustrated example, the second pad portion 41 is substantially rectangular as viewed in the z direction, although a different shape is also possible. As shown in FIG. 6, the second-pad obverse surface 41a and the second-pad reverse surface 41b of this embodiment are covered by the resin part 8.

As shown in FIGS. 1 to 3 and 6, the second pad portion 41 as viewed in the z direction is located in the first sense of the y direction from the first pad portion 21 and in a second sense of the x direction from the extended portion 22. In the z direction, the second pad portion 41 is located in the first sense of the z direction (upward in FIG. 11) from the first pad portion 21 and the extended portion 22. The second pad portion 41 is located at substantially the same position as the second pad portion 31 in the z direction.

As shown in FIGS. 3 and 5, the second-pad obverse surface 41a includes a second smooth region 411 and a second rough region 412. The second-pad obverse surface 41a of the illustrated example is plated with a layer of the second metal. Examples of the second metal include, but not limited to, Ni and Ag. The second smooth region 411 is bonded to a later-described second bonding portion 622 of the conductor member 62. As viewed in the z direction, the second smooth region 411 completely surrounds the second bonding portion 622 and extends outward in all directions. Although the second smooth region 411 in the illustrated example is substantially rectangular, the second smooth region 411 is not limited to a specific shape. The second smooth region 411 of the illustrated example is plated. Preferably, the second smooth region 411 has an x-direction dimension that is at least double the x-direction dimension of the second bonding portion 622.

The second rough region 412 is spaced apart from the second bonding portion 622 as viewed in the z direction. The second rough region 412 is rougher than the second smooth region 411. The means for increasing the roughness of the second rough region 412 relative to the second smooth region 411 is not specifically limited. As in the description given for the second rough region 312, the second smooth region 411 may be a surface of a common metal plate as a lead frame, and the second rough region 412 may be a surface roughened by laser. The laser used for roughening is not limited to a specific type, and suitable examples include, but not limited to, UV lasers, IR lasers, and green lasers. In the illustrated example, the second rough region 412 extends to the edges of the second-pad obverse surface 41a.

The second rough region 412 is not limited to a specific shape or size. As shown in FIG. 5, the second rough region 412 of this embodiment includes a first segment 4121, a second segment 4122 and a pair of third segments 4123. The first segment 4121 is adjacent to the second smooth region 411 in the second sense of the y direction (on the side on which the first pad portion 21 is located). The second segment 4122 is adjacent to the second smooth region 411 on the side opposite from the first segment 4121 (and also from the first pad portion 21). The pair of third segments 4123 are adjacent to the second smooth region 411 on the opposite sides in the x direction. In the illustrated example, the first segment 4121, the second segment 4122 and the third segment 4123 of the second rough region 412 define a rectangular frame surrounding the second smooth region 411 as viewed in the z direction.

The detailed construction of the second rough region 412 is not specifically limited. In one example, the second rough region 412 is similar to the second rough region 412 shown in FIG. 9.

As shown in FIGS. 1 to 3 and 11, the terminal portion 42 extends from the second pad portion 41 in the first sense of the y direction. The terminal portion 42 is used when the semiconductor device A1 is mounted on a circuit board, for example. The terminal portion 42 is not limited to a specific shape. In the illustrated example, the terminal portion 42 includes a root 421, a bend 422 and an extreme end 423.

The root 421 extends from the second pad portion 41 in the first sense of the y direction and has a shape elongated in the y direction. A portion of the root 421 is exposed from the resin part 8. The bend 422 is connected from the y-direction end of the root 421 and bent toward the second sense of the z direction (downward in FIG. 11) as viewed in the x direction. The extreme end 423 extends from the bend 422 in the first sense of the y direction.

The roughness of the first rough region 212 of the first pad portion 21, the second rough region 312 of the second pad portion 31, and the second rough region 412 of the second pad portion 41 is not specifically limited. By way of examples, the following are the parameter values defining the roughness of the first rough region 212, the second rough region 312 and the second rough region 412. Regarding the area roughness parameters, the arithmetic mean height Sa ranges from 0.34 to 4.2, and the maximum height Sz ranges from 3.6 to 26. Regarding the line roughness parameters, Ra ranges from 0.33 to 3.9, and the maximum height Rz ranges from 1.7 to 13. Using different parameters, the roughness of the first rough region 212, the second rough region 312 and the second rough region 412 can also be defined by the arithmetic mean peak curvature Spc ranging from 1400 to 5700, and the developed interfacial area ratio Sdr ranging from 0.067 to 2.2.

In one preferable relation of the roughness levels, the first rough region 212 has a higher roughness than the second rough region 312 or 412. To satisfy the roughness relation, the first rough region 212 is roughened by repeating laser scanning of the same spot or path a greater number of times than in the process of roughening the second rough regions 312 and 412. For example, the process of roughening the second rough regions 312 and 412 involves steering a laser beam once per path, whereas the process of roughening the first rough region 212 involves steering a laser beam two or more times along the same path. In this case, the recessed portions 212a of the first rough region 212 shown in FIG. 8 may have a stepped profile corresponding to the number of times the scanning is repeated.

[Conductor Member 61]

The conductor member 61 is used for electrically connecting the gate electrode 111 of the semiconductor element 1 to the second lead 3. The conductor member 61 is not limited to a specific construction. In one example, the may be a wire or ribbon of metal. Examples of the metal suitable for the conductor member 61 include Au, Al, and other metals, as well as alloys of such metals. Examples of the alloys include alloys of Al with Fe, Si, or Ni. According to this embodiment, the conductor member 61 is a wire made of Au.

As shown in FIGS. 1 to 3 and 6, the conductor member 61 has a first bonding portion 611 and a second bonding portion 612. The first bonding portion 611 is bonded to the gate electrode 111 of the semiconductor element 1. The second bonding portion 612 is bonded to the second pad portion 31 of the second lead 3, or more specifically to the second smooth region 311 of the second-pad obverse surface 31a. During the fabrication of the conductor member 61, the first bonding portion 611 and the second bonding portion 612 may be formed in any order. The conductor member 61 may be fabricated by capillary bonding, for example.

[Conductor Member 62]

The conductor member 62 is used for electrically connecting the source electrode 112 of the semiconductor element 1 to the second lead 4. The conductor member 62 is not limited to a specific construction. In one example, the conductor member 62 may be a wire or ribbon of metal. Examples of the metal suitable for the conductor member 62 include Au, Al, and other metals as well as alloys of such metals. Examples of the alloys include alloys of Al with Fe, Si, or Ni. According to this embodiment, the conductor member 62 is a wire made of Al or an alloy of Al. The conductor member 62 that is made of Al or an alloy of Al is thicker in diameter than the conductor member 61.

As shown in FIGS. 1 to 3 and 11, the conductor member 62 has a first bonding portion 621 and a second bonding portion 622. The first bonding portion 621 is bonded to the source electrode 112 of the semiconductor element 1. The second bonding portion 622 is bonded to the second pad portion 41 of the second lead 4, or more specifically to the second smooth region 411 of the second-pad obverse surface 41a. During the fabrication of the conductor member 62, the first bonding portion 621 and the second bonding portion 622 may be formed in any other. The conductor member 62 may be formed by wedge bonding, for example.

[Resin Part 8]

The resin part 8 covers the semiconductor element 1, the first lead 2, portions of the second leads 3 and 4, and the conductor members 61 and 62. The resin part 8 is made of thermosetting synthetic resin, which is an electrical insulating material. According to this embodiment, the resin part 8 is made of black epoxy resin and may contain appropriate fillers. As shown in FIGS. 1 to 3, 6, 10 and 11, the resin part 8 has a resin obverse surface 81, a resin reverse surface 82, a resin side surface 83, a resin side surface 84 and a pair of resin side surfaces 85.

The resin obverse surface 81 and the resin reverse surface 82 are opposite surfaces and spaced apart in the z direction.

The resin obverse surface 81 faces in the same direction as the element obverse surface 1a, and the resin reverse surface 82 faces in the same direction as the element reverse surface 1b. Each of the resin side surfaces 83, 84 and 85 extends between the resin obverse surface 81 and the resin reverse surface 82. The resin side surface 83 faces in the first sense of the y direction. The resin side surface 84 faces in the second sense of the y direction. The pair of resin side surfaces 85 face opposite in the y direction.

According to this embodiment, the first-pad reverse surface 21b is exposed on the resin reverse surface 82. The extended portion 22 and the terminal portions 32 and 42 extend out from the resin side surface 83. The projected portion 23 extends out from the resin side surface 84.

The following describes advantages of the semiconductor device A1.

According to this embodiment, the first pad portion 21 has the first rough region 212, and the second pad portion 31 has the second rough region 312 as shown in FIGS. 2 to 5 and 7 to 9. The first rough region 212 and the second rough region 312 locally form interlocking connections with the resin part 8 and thus prevent unintentional detachment of the resin part 8 from the first pad portion 21 and the second pad portion 31. Notably, the semiconductor element 1 is mounted on the first smooth region 211 rather than on the first rough region 212. This ensures that the bonding strength between the semiconductor element 1 and the first pad portion 21 is not reduced. In addition, the second bonding portion 612 of the conductor member 61 is bonded to the second smooth region 311. The present inventors have found that bonding the second bonding portion 612 to a smoother surface is preferable for making a stronger bond. In addition, the second pad portion 41 has the second smooth region 411 and the second rough region 412, so that the same advantages can be achieved. This embodiment can therefore ensure good adhesion between the resin part 8 and each of the first lead 2 and the second leads 3 and 4, without affecting proper operation of the semiconductor device A1.

As shown in FIG. 3, the first rough region 212 includes the first segment 2121. This can prevent detachment of the resin part 8 from the first pad portion 21 on the side on which the second pad portion 31 and the second pad portion 41 are located. The first rough region 212 also includes the second segment 2122. This can prevent detachment of the resin part 8 from the first pad portion 21 on the side opposite from the second pad portion 31 and the second pad portion 41, that is on the side thus closer to the projected portion 23. The first rough region 212 also includes the third segment 2123. This can prevent detachment of the resin part 8 from the first pad portion 21 along the edges opposite in the x direction. In addition, the first rough region 212 extends to the edges of the first-pad obverse surface 21a. This configuration is preferable for reliably preventing detachment of the resin part 8 from the first pad portion 21.

As shown in FIG. 4, the second rough region 312 includes the first segment 3121. This can prevent detachment of the resin part 8 from the second pad portion 31 on the side on which the first pad portion 21 is located. The second rough region 312 also includes the second segment 3122. This can prevent detachment of the resin part 8 from the second pad portion 31 on the side opposite from the first pad portion 21 and thus closer to the terminal portion 32. The second rough region 312 also includes the third segment 3123. This can prevent detachment of the resin part 8 from the second pad portion 31 along the edges opposite in the x direction. In addition, the second rough region 312 extends to the edges of the second-pad obverse surface 31a. This configuration is preferable for reliably preventing detachment of the resin part 8 from the second pad portion 31.

As shown in FIG. 5, the second rough region 412 includes the first segment 4121. This can prevent detachment of the resin part 8 from the second pad portion 41 on the side on which the first pad portion 21 is located. The second rough region 412 also includes the second segment 4122. This can prevent detachment of the resin part 8 from the second pad portion 41 on the side opposite from the first pad portion 21 and thus closer to the terminal portion 42. The second rough region 412 also includes the third segment 4123. This can prevent detachment of the resin part 8 from the second pad portion 41 along the edges opposite in the x direction. In addition, the second rough region 412 extends to the edges of the second-pad obverse surface 41a. This configuration is preferable for reliably preventing detachment of the resin part 8 from the second pad portion 41.

As shown in FIG. 3, the first smooth region 211 is a flat surface not coated or plated, so that the first metal, such as Cu, is exposed on the surface. Such a surface is preferable for bonding the semiconductor element 1 with the conductive bonding material 19. The second smooth regions 311 and 411 are plated with the second metal, such as Ni, as shown in FIGS. 3 to 5. The plated surface is effective to improve the bonding strength of the second bonding portions 612 and 622.

As shown in FIG. 8, the first rough region 212 includes a plurality of micro-protrusions 212c. The presence of the micro-protrusions more reliably prevents detachment of the resin part 8 from the first pad portion 21. The present inventors have confirmed that the use of a green laser for roughening the first rough region 212 promotes the formation of a plurality of micro-protrusions 212c.

As shown in FIG. 9, the second rough region 312 includes a plurality of micro-protrusions 312c. The presence of the micro-protrusions more reliably prevents detachment of the resin part 8 from the second pad portion 31. The present inventors have also confirmed that the use of a green laser for roughening the second rough region 312 promotes the formation of a plurality of micro-protrusions 312c. In addition, before the roughening process, the surface of the first metal, such as Cu, is plated with a metal layer 319 made of the second metal. The laser roughening is then performed on the resulting surface of the first metal by using a green laser for example. This roughening forms a preferable profile having the recessed portions 312a made of the first metal and the raised portions 312b made of the second metal as shown in FIG. 9.

In addition, the recessed portions 312a are regions where the first metal of Cu forming the second lead 3 is exposed. In contrast, the raised portions 312b are provided by fragments of the plated metal layer 319 made of the second metal, such as Ni. The present inventors have confirmed that the presence of the recessed portions 312a penetrating the metal layer 319 to the first metal is significantly effective to prevent detachment of the resin part 8.

In addition, increasing the roughness of the first rough region 212 than the second rough regions 312 and 412 is effective for more reliably preventing unintentional detachment of the resin part 8 from the first pad portion 21. For example, when the semiconductor element 1 is a power semiconductor chip, the first pad portion 21 may be subjected to large temperature changes. Reliably protecting such a portion from detachment is preferable.

FIGS. 13 to 21 show variations and other embodiments of the present disclosure. In these figures, the same reference numerals as those used in the above embodiment denote the same or similar elements.

First Variation of First Embodiment

Figure 13:
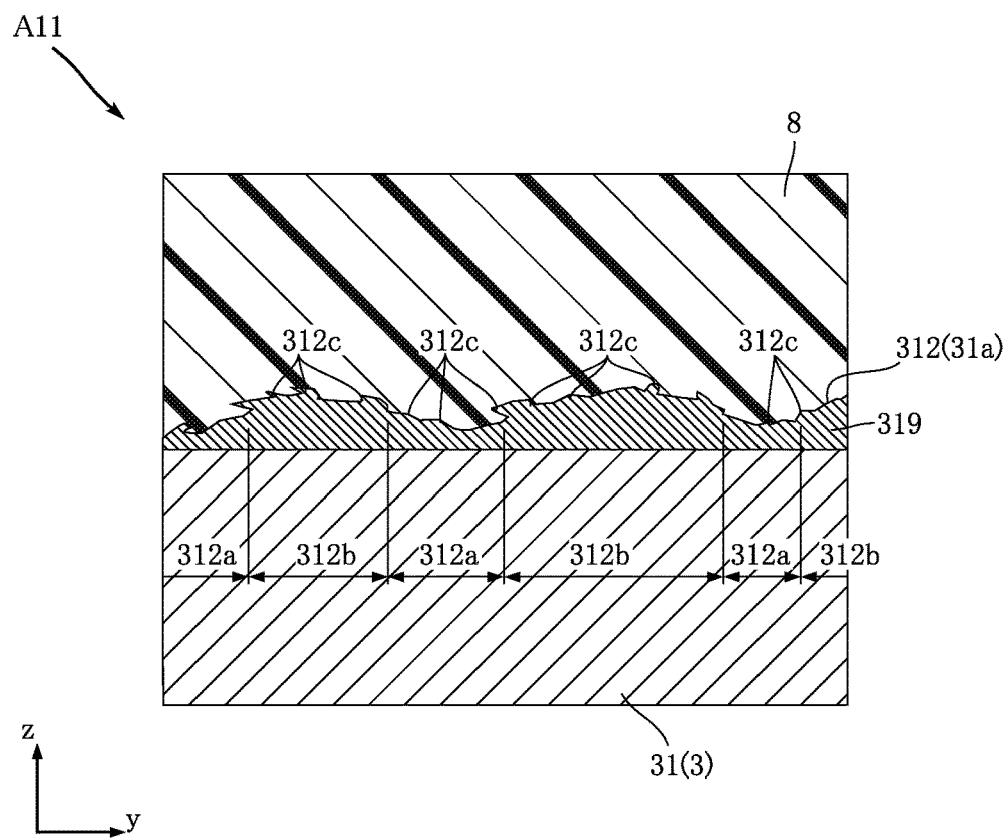
FIG. 13 is an enlarged fragmentary sectional view of a second rough region of a semiconductor device according to a first variation of the first embodiment of the present disclosure.

FIG. 13 is an enlarged fragmentary sectional view of a second rough region 312 according to a first variation of the semiconductor device A1. The semiconductor device A11 of this variation is provided with the second rough region 312 roughened by using a green laser, similarly to the second rough region 312 of the semiconductor device A1. The recessed portions 312a of this variation, however, terminate within the metal layer 319 and do not penetrate the metal layer 319. Thus, the first metal of Cu forming the second lead 3 is not exposed through the recessed portions 312a. In one example, the thickness of the metal layer 319 is 3 to 6 µm, and the depth of the roughness of the second rough region 312 (the distance between the bottom of a recessed portion 312a to the top of a raised portion 312b) is smaller than the thickness of the metal layer 319. In one example, the depth of the roughness is 1 to 4 µm.

The second rough region 312 of this variation has a plurality of micro-protrusions 312c.

This variation can therefore achieve good adhesion between the resin part 8 and each of the first lead 2 and the second leads 3 and 4, without affecting proper operation of the semiconductor device A11. As can be understood from this variation, the second rough region 312 may be provided with the recessed portions 312a not reaching the first metal of the second lead 3, instead of recessed portions through which the first metal is exposed. The presence of such recessed portions 312a along with the raised portions 312b and the micro-protrusions 312c is still effective to promote adhesion with the resin part 8.

Second Variation of First Embodiment

Figure 14:
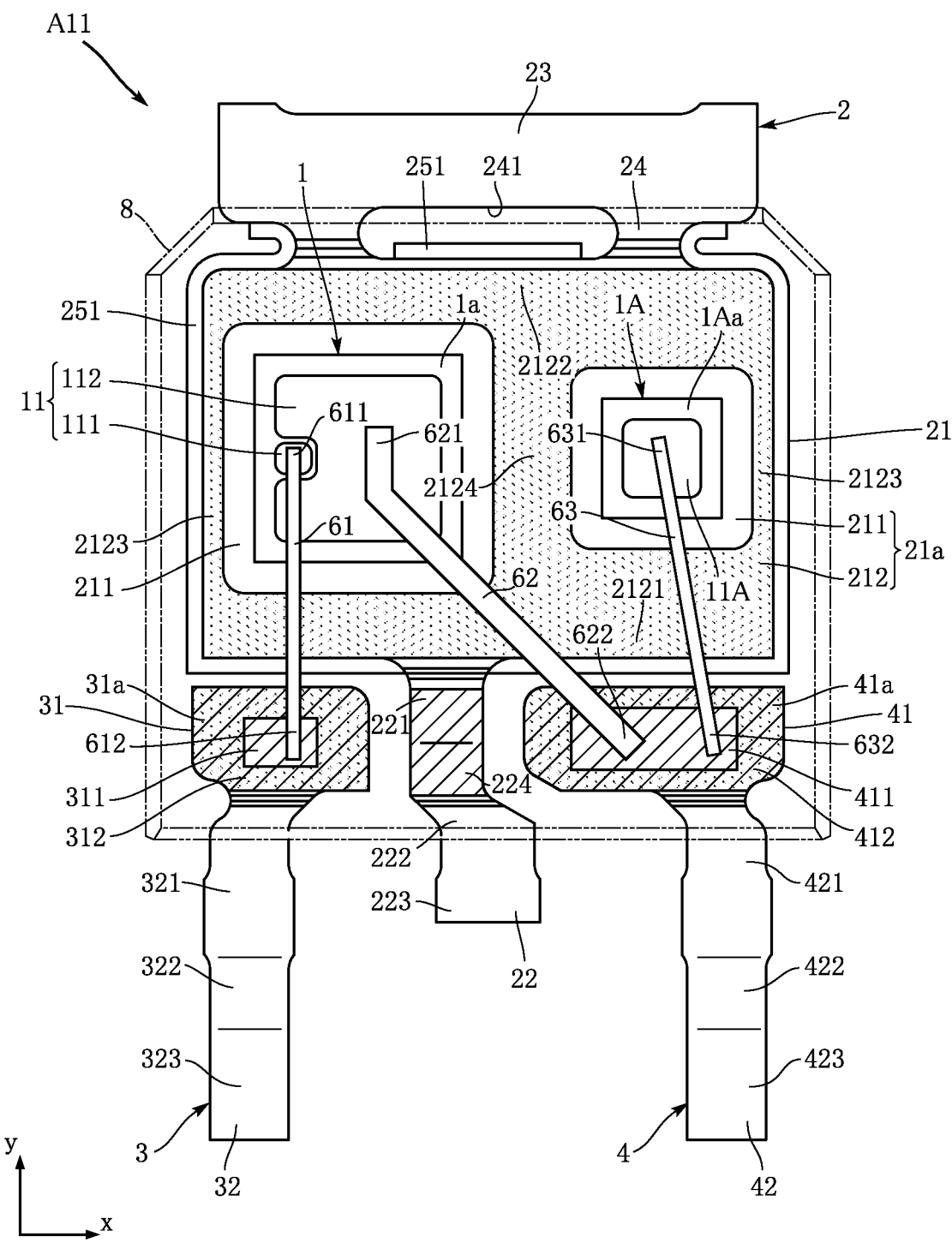
FIG. 14 is a plan view of a semiconductor device according to a second variation of the first embodiment of the present disclosure.

FIG. 14 shows a second variation of the semiconductor device A1. The semiconductor device A12 of this variation additionally includes a semiconductor element 1A and a conductor member 63.

The semiconductor element 1A is a diode, for example. The first pad portion 21 has two first smooth regions 211 on the first-pad obverse surface 21a. The semiconductor element 1 mounted on one first smooth region 211, and the semiconductor element 1A is mounted on the other first smooth region 211.

The first rough region 212 of this variation includes a fourth segment 2124, in addition to the first segment 2121, the second segment 2122 and the pair of third segments 2123. The fourth segment 2124 is a region elongated in the y direction and connecting the first segment 2121 and the second segment 2122. The fourth segment 2124 separates the two first smooth regions 211 from each other.

The conductor member 63 has a first bonding portion 631 and a second bonding portion 632. The conductor member 63 may be made of any suitable the material, including, but not limited to, Au, Al, and alloys of these metals. The first bonding portion 631 is bonded to the obverse surface electrode 11A of the semiconductor element 1A. The second bonding portion 632 is bonded to the second lead 4 at the second smooth region 411 on the second-pad obverse surface 41a. That is, the second bonding portions 622 and 632 are both bonded to the same second rough region 412.

The semiconductor device A12 of this variation can therefore achieve good adhesion between the resin part 8 and each of the first lead 2 and the second leads 3 and 4, without affecting proper operation. As can be understood from this variation, the semiconductor device according to the present disclosure can include two or more semiconductor elements. In addition, the second rough region according to the present disclosure can be bonded to two or more conductor members.

Third Variation of First Embodiment

Figure 15:
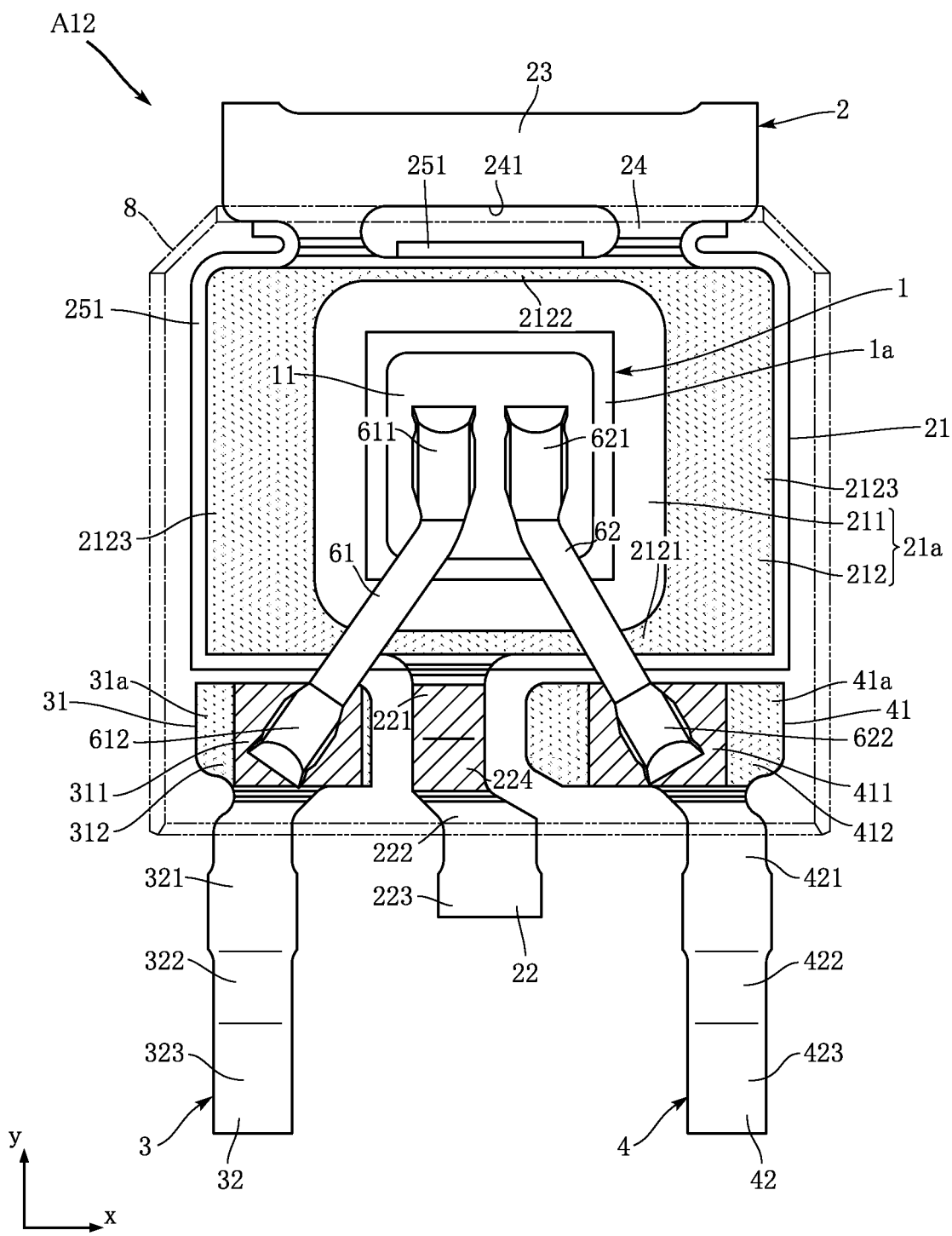
FIG. 15 is a plan view of a semiconductor device according to a third variation of the first embodiment of the present disclosure.

FIG. 15 shows a third variation of the semiconductor device A1. The semiconductor device A13 of this variation includes a semiconductor element 1 of a different construction from the one described above. The semiconductor device A13 of this variation may be a diode.

According to this variation, the first bonding portions 611 and 621 of the conductor members 61 and 62 are both bonded to the obverse surface electrode 11. The conductor members 61 and 62 are made of Al or an alloy of Al. The second bonding portion 612 is bonded to the second smooth region 311, and the second bonding portion 622 is bonded to the second smooth region 411. According to this configuration, the second leads 3 and 4 serve as conductive members held at the same potential.

The semiconductor device A13 of this variation can therefore achieve good adhesion between the resin part 8 and each of the first lead 2 and the second leads 3 and 4, without affecting proper operation. As can be understood from this variation, the semiconductor element used in the present disclosure is not limited to a specific type. In addition, the conductor members and the second leads used in this embodiment can vary depending on the type or construction of the semiconductor element.

Second Embodiment

FIGS. 16 to 20 show a semiconductor device according to a second embodiment of the present disclosure. The semiconductor device A2 of this embodiment includes a semiconductor element 1, a first lead 2, a second lead 3, a second lead 4, a conductor member 61, a plurality of conductor members 62 and a resin part 8.

Figure 16:
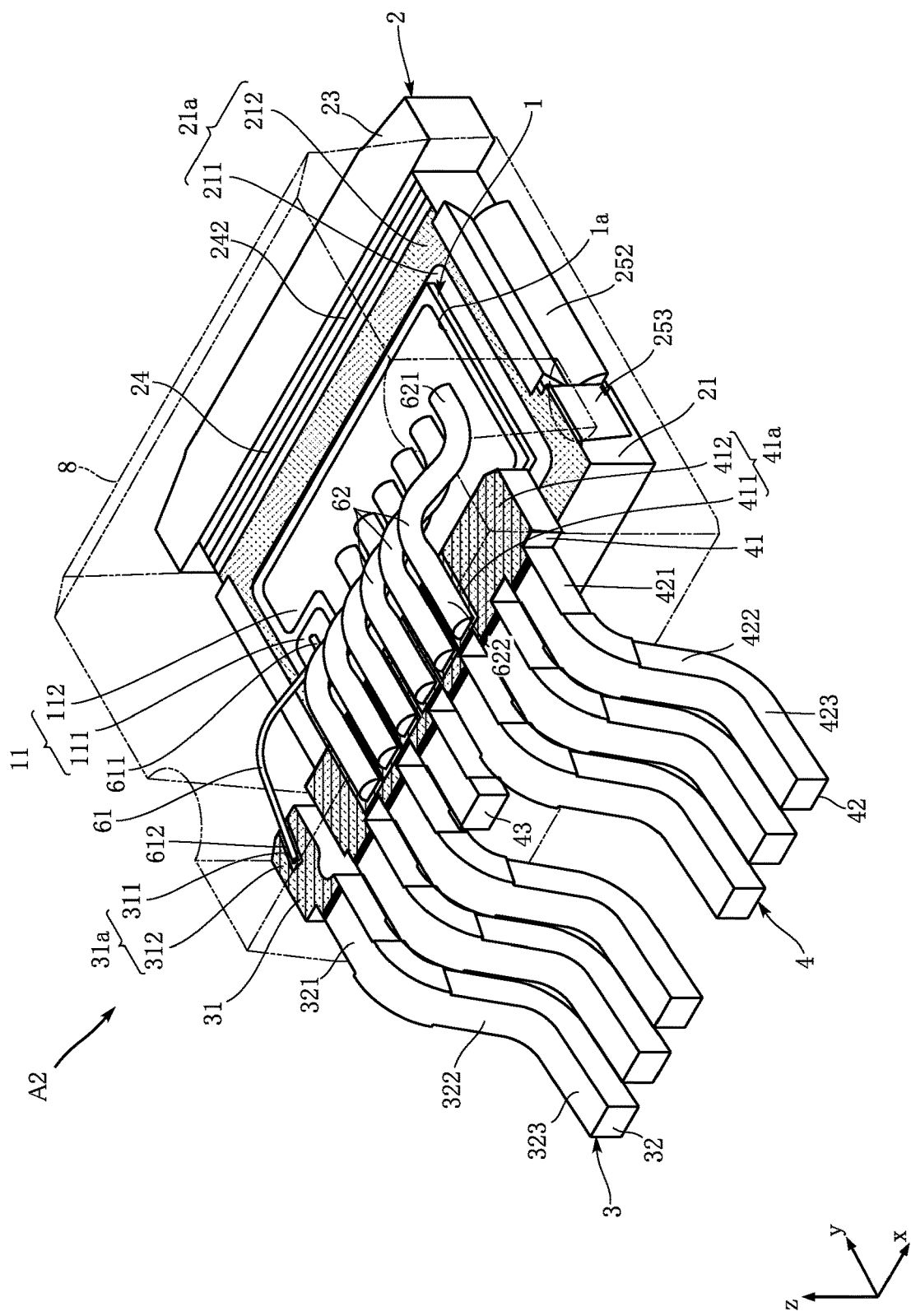
FIG. 16 is a perspective view of a semiconductor device according to a second embodiment of the present disclosure.
Figure 17:
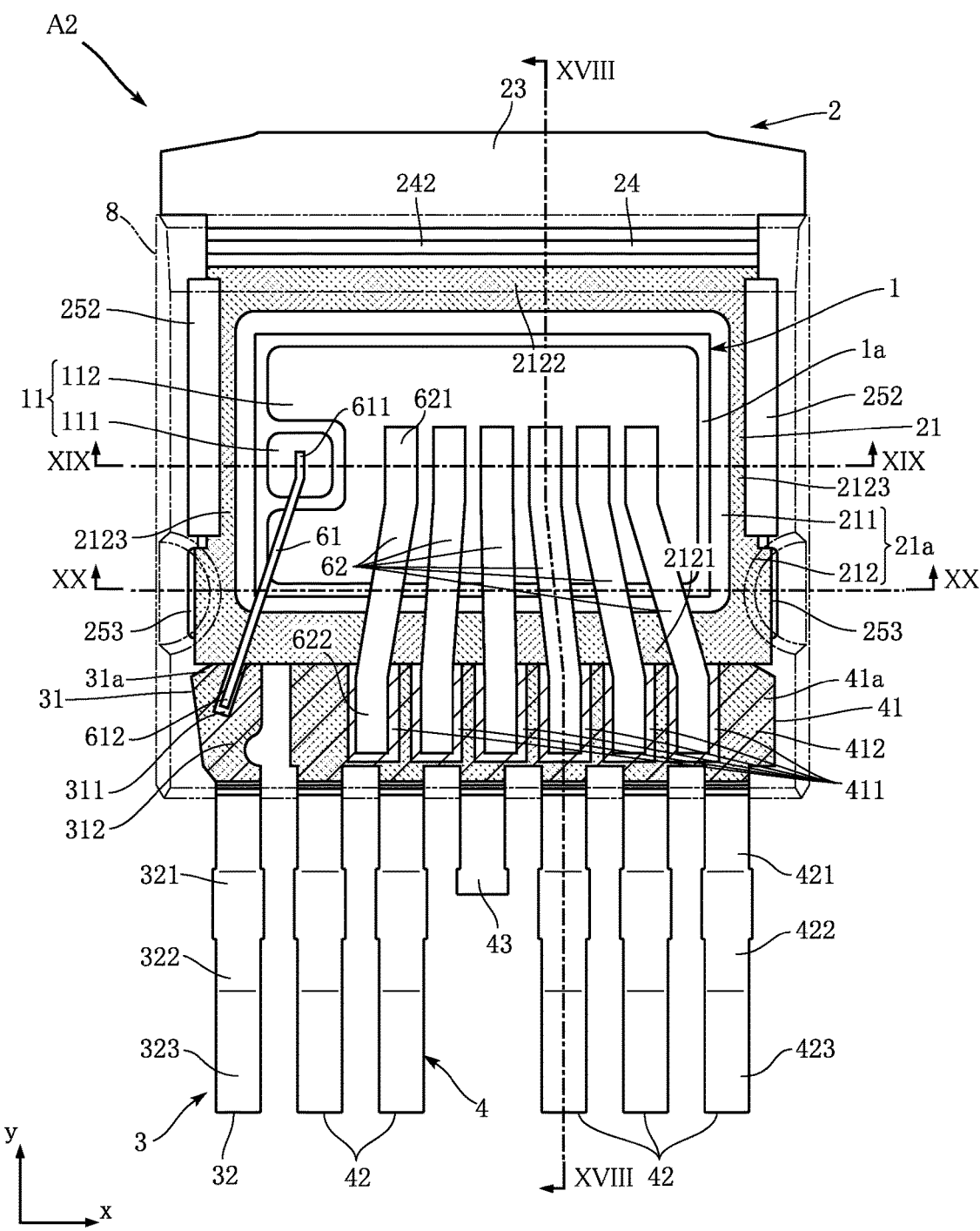
FIG. 17 is a plan view of the semiconductor device according to the second embodiment of the present disclosure.
Figure 18:
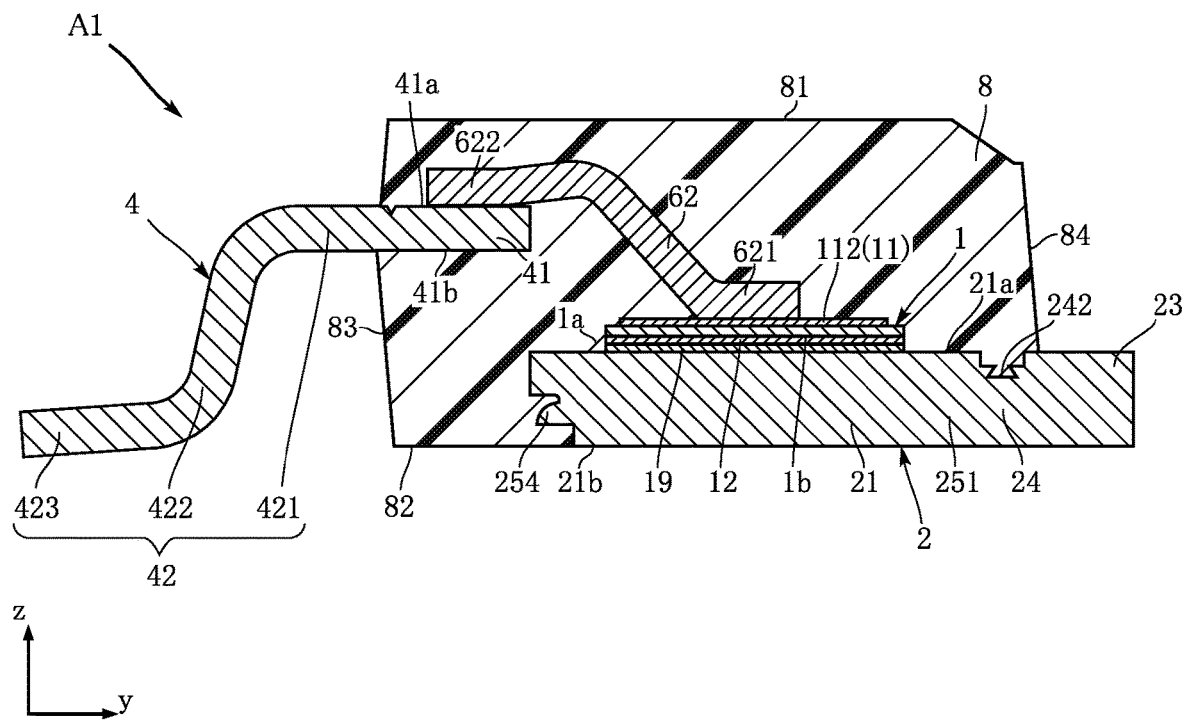
FIG. 18 is a sectional view taken along line XVIII-XVIII of FIG. 17.
Figure 19:
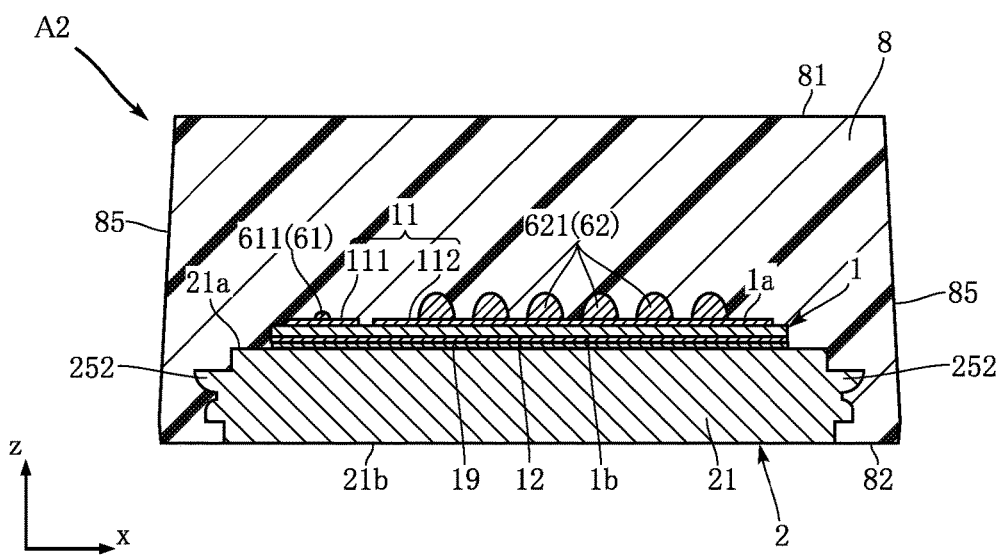
FIG. 19 is a sectional view taken along line XIX-XIX of FIG. 17.
Figure 20:
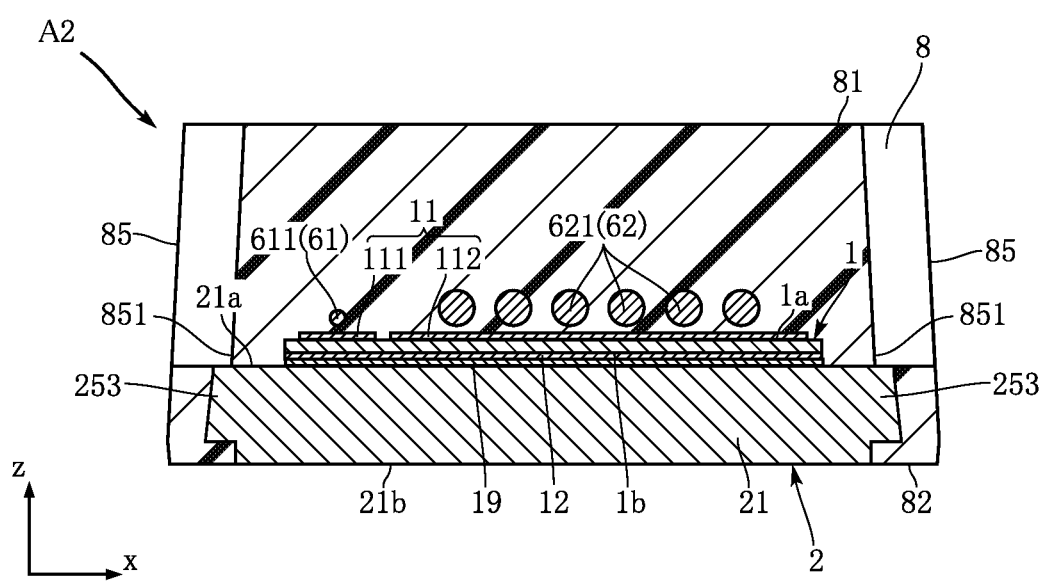
FIG. 20 is a sectional view taken along line XX-XX of FIG. 17.

FIG. 16 is a perspective view of the semiconductor device A2. FIG. 17 is a plan view of the semiconductor device A2. FIG. 18 is a sectional view taken along line XVIII-XVIII of FIG. 17. FIG. 19 is a sectional view taken along line XIX-XIX of FIG. 17. FIG. 20 is a sectional view taken along line XX-XX of FIG. 17.

The semiconductor element 1 of this embodiment may be similar in construction to the semiconductor element 1 of the semiconductor device A1, and includes a gate electrode 111 and a source electrode 112 as the obverse surface electrodes 11 and also includes a drain electrode 12.

The first lead 2 has a first pad portion 21. The first pad portion 21 is similar in construction to the first pad portion 21 of the semiconductor device A1. According to this embodiment, the first pad portion 21 is formed with anchoring features 252, 253 and 254. Similarly to the anchoring feature 251, the anchoring features 252, 253 and 254 enable the resin part 8 to more firmly retain the first pad portion 21. Each anchoring feature 252 is aligned with a corresponding one of the anchoring features 253 in the y direction. The anchoring feature 254 extends out from the first pad portion 21 in the y direction toward the side on which the second leads 3 and 4 are located.

The second lead 3 of this embodiment includes a second pad portion 31 of a shape different from the second pad portion 31 of the semiconductor device A1. The second smooth region 311 is elongated at an angle relative to the y direction.

The first bonding portion 611 of the conductor member 61 is bonded to the gate electrode 111 of the semiconductor element 1. The second bonding portion 612 is bonded to the second smooth region 311. According to this embodiment, the second bonding portion 612 is bonded to the second smooth region 311 such that the longitudinal direction of the second bonding portion 612 is substantially aligned with the longitudinal direction of the second smooth region 311. The conductor member 61 may be a wire made of Au.

The second lead 4 of this embodiment includes a second pad portion 41, a plurality of terminal portions 42 and an extended portion 43.

In the present embodiment, the second pad portion 41 has a shape elongated in the x direction as viewed in the z direction. The second-pad obverse surface 41a includes a plurality of second smooth regions 411 and a second rough region 412. The second smooth regions 411 are substantially rectangular regions elongated in the y direction and spaced apart from each other in the x direction. The second rough region 412 has portions each interposed between two adjacent second smooth regions 411.

The terminal portions 42 are spaced apart from each other in the x direction and extend from the second pad portion 41 in the y direction. The extended portion 43 is located between two terminal portions 42 in the x direction and extends from the second pad portion 41 in the x direction.

The first bonding portions 621 of the respective conductor members 62 are bonded to the source electrode 112 of the semiconductor element 1. The second bonding portions 622 of the respective conductor members 62 are separately bonded to the individual second smooth regions 411. The longitudinal direction of each second bonding portion 622 is substantially aligned with the longitudinal direction of the corresponding second smooth region 411 and thus extends substantially in the y direction.

The resin part 8 of this embodiment has two recessed portions 851. Each recessed portion 851 is recessed from the resin obverse surface 81 and also from a resin side surface 85.

The semiconductor device A2 of this embodiment can also achieve good adhesion between the resin part 8 and each of the first lead 2 and the second leads 3 and 4, without affecting proper operation. According to this embodiment, the plurality of conductor members 62 can be bonded to the one source electrode 112 (obverse surface electrode 11). In addition, the second bonding portions 622 of the conductor members 62 can be bonded to the separate second smooth regions 411 of the one second pad portion 41.

First Variation of Second Embodiment

Figure 21:
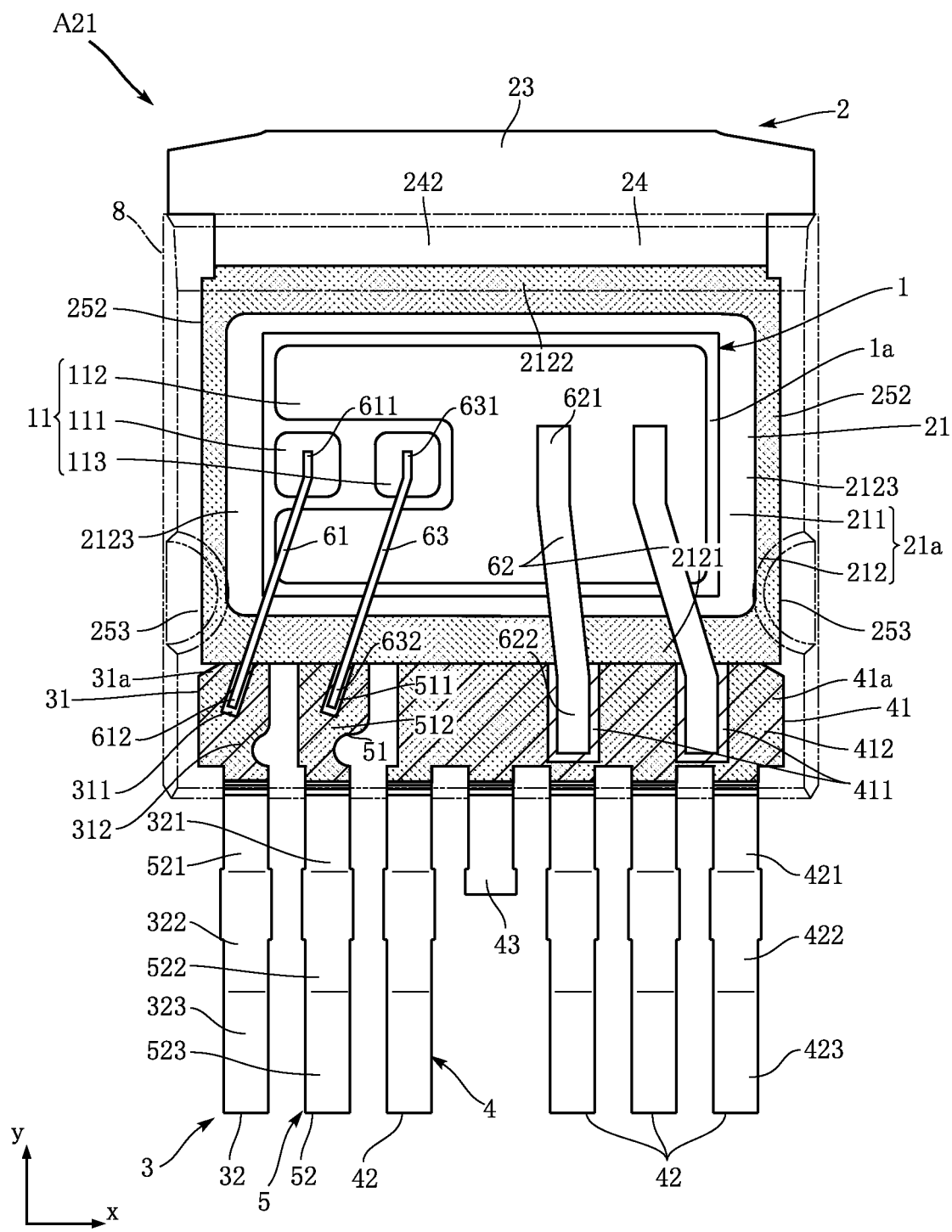
FIG. 21 is a plan view of a semiconductor device according to a first variation of the second embodiment of the present disclosure.

FIG. 21 shows a first variation of the semiconductor device A2. The semiconductor device A21 of this variation includes a semiconductor element 1, a first lead 2, a second lead 3, a second lead 4, a second lead 5, a conductor member 61, a plurality of conductor members 62, a conductor member 63 and a resin part 8.

The semiconductor element 1 of this embodiment includes a gate electrode 111, a source electrode 112 and a source sense electrode 113 as the obverse surface electrodes 11.

The source sense electrode 113 is substantially identical in size and shape to the gate electrode 111 and is disposed next to the gate electrode 111 in the x direction.

The second lead 4 is spaced apart from the second lead 3 in the x direction and includes a second pad portion 41, a plurality of terminal portions 42 and an extended portion 43.

The second lead 5 is identical in construction to the second lead 3 (and also to the second lead 4). According to this embodiment, the second lead 5 is disposed between the second lead 3 and the second lead 4 in the x direction. The second lead 5 includes a second pad portion 51 and a terminal portion 52. The second pad portion 51 and the terminal portion 52 are similar in construction to the second pad portion 41 and the terminal portion 42, respectively. The second pad portion 51 is provided with a second smooth region 511 and a second rough region 512. The second smooth region 511 and the second rough region 512 are similar in construction to the second smooth region 411 and the second rough region 412, respectively.

The first bonding portion 611 of the conductor member 61 is bonded to the gate electrode 111, and the second bonding portion 612 is bonded to the second smooth region 311. The first bonding portions 621 of the respective conductor members 62 are bonded to the source electrode 112, and the second bonding portions 622 are separately bonded to the individual second smooth regions 411. The conductor member 63 has a first bonding portion 631 and a second bonding portion 632. The conductor member 63 is similar in construction to the conductor member 61, for example. The first bonding portion 611 is bonded to the source sense electrode 113, and the second bonding portion 632 is bonded to the second smooth region 511.

The semiconductor device A21 of this variation can also achieve good adhesion between the resin part 8 and each of the first lead 2 and the second leads 3, 4 and 5, without affecting proper operation. As can be understood from this embodiment, the obverse surface electrodes 11 are not limited to a specific construction. Depending on the construction of the obverse surface electrodes 11, the semiconductor device may include one or more additional second leads, such as the second lead 5, besides the second leads 3 and 4.

The semiconductor devices according to the present disclosure are not limited to those of the embodiments described above. Various design changes can be made to the specific construction of one or more components of the semiconductor devices according to the present disclosure.

[Clause 1]

A semiconductor device comprising:
  a semiconductor element including an element obverse surface and an element reverse surface facing away from each other in a first direction;
  a first lead including a first pad portion on which the semiconductor element is mounted;
  a second lead including a second pad portion disposed side by side with the first pad portion in a second direction perpendicular to the first direction;
  a conductor member including a first bonding portion bonded to the semiconductor element and a second bonding portion bonded to the second pad portion; and
  a resin part covering the semiconductor element, the conductor member, the first pad portion and the second pad portion,
  wherein the first pad portion comprises a first-pad obverse surface including a first smooth region to which the element reverse surface is bonded and a first rough region spaced apart from the semiconductor element as viewed in the first direction, the first rough region having a higher surface roughness than the first smooth region, and the second pad portion comprises a second-pad obverse surface including a second smooth region to which the second bonding portion is bonded and a second rough region spaced apart from the second bonding portion as viewed in the first direction, the second rough region having a higher surface roughness than the second smooth region.

[Clause 2]

The semiconductor device according to Clause 1, wherein the first rough region includes a first segment offset with respect to the first smooth region toward the second pad portion.

[Clause 3]

The semiconductor device according to Clause 1 or 2, wherein the first rough region includes a second segment opposite to the second pad portion with respect to the first smooth region.

[Clause 4]

The semiconductor device according to any one of Clauses 1 to 3, wherein the first rough region includes a third segment adjacent to the first smooth region in a third direction perpendicular to the first direction and the second direction.

[Clause 5]

The semiconductor device according to any one of Clauses 1 to 4, wherein the second rough region includes a first segment offset with respect to the second smooth region toward the first pad portion.

[Clause 6]

The semiconductor device according to any one of Clauses 1 to 5, wherein the second rough region includes a second segment opposite to the first pad portion with respect to the second smooth region.

[Clause 7]

The semiconductor device according to any one of Clauses 1 to 6, wherein the second rough region includes a third segment adjacent to the second smooth region in a third direction perpendicular to the first direction and the second direction.

[Clause 8]

The semiconductor device according to any one of Clauses 1 to 7, wherein the first pad portion contains a first metal, and the first-pad obverse surface is made of the first metal.

[Clause 9]

The semiconductor device according to Clause 8, wherein the second pad portion contains a second metal and a third metal disposed on a surface of the second metal.

[Clause 10]

The semiconductor device according to Clause 9, the second smooth region is made of the third metal.

[Clause 11]

The semiconductor device according to Clause 10, wherein the second rough region includes a plurality of recessed portions made of the second metal, and a plurality of raised portions each located between two adjacent recessed portions of the recessed portions and made of the third metal.

[Clause 12]

The semiconductor device according to any one of Clauses 1 to 11, wherein the first rough region has a higher surface roughness than the second rough region.

[Clause 13]

The semiconductor device according to any one of Clauses 1 to 12, wherein the second-pad obverse surface is offset from the first-pad obverse surface in a sense of the first direction in which the first-pad obverse surface is facing.

[Clause 14]

The semiconductor device according to Clause 13, wherein the second-pad obverse surface is offset from the element obverse surface in a sense of the first direction in which the element obverse surface is facing.

[Clause 15]

The semiconductor device according to any one of Clauses 1 to 14, wherein the first lead comprises a first-pad reverse surface facing away from the first-pad obverse surface in the first direction and exposed from the resin part.

[Clause 16]

The semiconductor device according to any one of Clauses 1 to 15, wherein the second lead includes a terminal portion protruding from the resin part in the second direction.

[Clause 17]

The semiconductor device according to any one of Clauses 1 to 16, wherein the semiconductor element includes a gate electrode and a source electrode disposed on the element obverse surface, and a drain electrode disposed on the element reverse surface, the first bonding portion of the conductor member is bonded to at least one of the gate electrode and the source electrode, and the drain electrode is electrically bonded to the first smooth region.

The invention claimed is:

1. A semiconductor device comprising:
   a semiconductor element including an element obverse surface and an element reverse surface facing away from each other in a first direction;
   a first lead including a first pad portion on which the semiconductor element is mounted;
   a second lead including a second pad portion disposed side by side with the first pad portion in a second direction perpendicular to the first direction;
   a conductor member including a first bonding portion bonded to the semiconductor element and a second bonding portion bonded to the second pad portion; and
   a resin part covering the semiconductor element, the conductor member, the first pad portion and the second pad portion,
   wherein the first pad portion comprises a first-pad obverse surface including a first smooth region to which the element reverse surface is bonded and a first rough region spaced apart from the semiconductor element as viewed in the first direction, the first rough region having a higher surface roughness than the first smooth region,
   the second pad portion comprises a second-pad obverse surface including a second smooth region to which the second bonding portion is bonded and a second rough region spaced apart from the second bonding portion as viewed in the first direction, the second rough region having a higher surface roughness than the second smooth region,
   the first pad portion contains a first metal, and the first-pad obverse surface is made of the first metal,
   the second pad portion contains a second metal and a third metal disposed on a surface of the second metal,
   the second smooth region is made of the third metal,
   the second rough region includes a plurality of recessed portions made of the second metal, and a plurality of raised portions each located between two adjacent recessed portions of the recessed portions and made of the third metal.

2. The semiconductor device according to claim 1, wherein the first rough region includes a first segment offset with respect to the first smooth region toward the second pad portion.

3. The semiconductor device according to claim 1, wherein the first rough region includes a second segment opposite to the second pad portion with respect to the first smooth region.

4. The semiconductor device according to claim 1, wherein the first rough region includes a third segment adjacent to the first smooth region in a third direction perpendicular to the first direction and the second direction.

5. The semiconductor device according to claim 1, wherein the second rough region includes a first segment offset with respect to the second smooth region toward the first pad portion.

6. The semiconductor device according to claim 1, wherein the second rough region includes a second segment opposite to the first pad portion with respect to the second smooth region.

7. The semiconductor device according to claim 1, wherein the second rough region includes a third segment adjacent to the second smooth region in a third direction perpendicular to the first direction and the second direction.

8. The semiconductor device according to claim 1, wherein the first rough region has a higher surface roughness than the second rough region.

9. The semiconductor device according to claim 1, wherein the second-pad obverse surface is offset from the first-pad obverse surface in a sense of the first direction in which the first-pad obverse surface is facing.

10. The semiconductor device according to claim 9, wherein the second-pad obverse surface is offset from the element obverse surface in a sense of the first direction in which the element obverse surface is facing.

11. The semiconductor device according to claim 1, wherein the first lead comprises a first-pad reverse surface facing away from the first-pad obverse surface in the first direction and exposed from the resin part.

12. The semiconductor device according to claim 1, wherein the second lead includes a terminal portion protruding from the resin part in the second direction.

13. The semiconductor device according to claim 1, wherein the semiconductor element includes a gate electrode and a source electrode disposed on the element obverse surface, and a drain electrode disposed on the element reverse surface, the first bonding portion of the conductor member is bonded to at least one of the gate electrode and the source electrode, and the drain electrode is electrically bonded to the first smooth region.

* * * * *